(12) United States Patent
Harada et al.

(10) Patent No.: US 9,311,697 B2
(45) Date of Patent: Apr. 12, 2016

(54) INSPECTION METHOD AND DEVICE THEREFOR

(75) Inventors: Minoru Harada, Fujisawa (JP); Ryo Nakagaki, Kawasaki (JP); Takehiro Hirai, Ushiku (JP); Naoki Hosoya, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 450 days.

(21) Appl. No.: 13/639,103

(22) PCT Filed: Apr. 1, 2011

(86) PCT No.: PCT/JP2011/058396
§ 371 (c)(1),
(2), (4) Date: Dec. 6, 2012

(87) PCT Pub. No.: WO2011/125925
PCT Pub. Date: Oct. 13, 2011

(65) Prior Publication Data
US 2013/0108147 A1    May 2, 2013

(30) Foreign Application Priority Data
Apr. 6, 2010    (JP) .................................. 2010-087799

(51) Int. Cl.
*G06K 9/00*    (2006.01)
*G06T 7/00*    (2006.01)
*H01L 21/66*    (2006.01)

(52) U.S. Cl.
CPC ............... *G06T 7/0004* (2013.01); *G06T 7/001* (2013.01); *H01L 22/12* (2013.01); *G06T 2207/10061* (2013.01); *G06T 2207/30148* (2013.01); *H01L 2924/0002* (2013.01)

(58) Field of Classification Search
None
See application file for complete search history.

(56) References Cited

U.S. PATENT DOCUMENTS

| 5,801,965 | A  | * | 9/1998  | Takagi et al. ................... 702/35 |
| 5,999,003 | A  | * | 12/1999 | Steffan et al. ................. 324/537 |
| 6,128,403 | A  | * | 10/2000 | Ozaki ........................... 382/145 |
| 6,185,324 | B1 | * | 2/2001  | Ishihara et al. ............... 382/149 |
| 6,388,747 | B2 | * | 5/2002  | Nara et al. .................... 356/394 |
| 6,421,122 | B2 | * | 7/2002  | Nara et al. .................... 356/394 |

(Continued)

FOREIGN PATENT DOCUMENTS

| JP | 2000-97869  | 4/2000 |
| JP | 2001-189358 | 7/2001 |

(Continued)

*Primary Examiner* — Jayesh A Patel
(74) *Attorney, Agent, or Firm* — Baker Botts L.L.P.

(57) ABSTRACT

Disclosed is a method of inspecting an object to be inspected in a semiconductor manufacturing process, for resolving the problem to increase defect detection sensitivity. An image capture means is used to image capture a designated area of the object to be inspected; a defect is detected in the captured image; a circuit pattern is recognized from the captured image; a characteristic value is computed, relating to an image tone and shape, from the detected defect; a characteristic value is computed, relating to the image tone and shape, from the recognized circuit pattern; either a specified defect or circuit pattern is filtered and extracted from the detected defect and the recognized circuit pattern; a mapping characteristic value is determined from the characteristic value of either the filtered and extracted specified defect or circuit pattern; and the distribution of the determined characteristic values is displayed onscreen in a map format.

17 Claims, 19 Drawing Sheets

(56) References Cited

U.S. PATENT DOCUMENTS

| | | | |
|---|---|---|---|
| 6,982,556 B2 * | 1/2006 | Chung | 324/527 |
| 7,068,834 B1 * | 6/2006 | Ikeda et al. | 382/145 |
| 7,269,280 B2 * | 9/2007 | Hiroi et al. | 382/149 |
| 7,512,501 B2 * | 3/2009 | Morinaga et al. | 702/35 |
| 7,720,275 B2 * | 5/2010 | Shibuya et al. | 382/149 |
| 2002/0009220 A1 * | 1/2002 | Tanaka | 382/145 |
| 2003/0014197 A1 * | 1/2003 | Weng | 702/35 |
| 2003/0062487 A1 | 4/2003 | Hiroi et al. | |
| 2005/0033538 A1 * | 2/2005 | Okabe | G01N 21/95607 702/82 |
| 2006/0038987 A1 | 2/2006 | Maeda et al. | |
| 2006/0045326 A1 | 3/2006 | Toyoda et al. | |
| 2006/0078188 A1 * | 4/2006 | Kurihara et al. | 382/149 |
| 2006/0078189 A1 * | 4/2006 | Hosoya | G06K 9/033 382/149 |
| 2007/0031026 A1 | 2/2007 | Kurihara et al. | |
| 2007/0047800 A1 * | 3/2007 | Hiroi et al. | 382/149 |
| 2007/0201739 A1 * | 8/2007 | Nakagaki et al. | 382/149 |
| 2008/0317329 A1 | 12/2008 | Shibuya et al. | |
| 2009/0161943 A1 * | 6/2009 | Yamashita et al. | 382/149 |
| 2009/0316980 A1 * | 12/2009 | Hanada | 382/149 |
| 2010/0004875 A1 | 1/2010 | Urano et al. | |

FOREIGN PATENT DOCUMENTS

| | | |
|---|---|---|
| JP | 2003-59441 | 2/2003 |
| JP | 2003-106829 | 4/2003 |
| JP | 2006-66478 | 3/2006 |
| JP | 2007-40910 | 2/2007 |
| JP | 2009-2743 | 1/2009 |
| JP | 2010-14635 | 1/2010 |

* cited by examiner

INSPECTION METHOD AND DEVICE THEREFOR

TECHNICAL FIELD

The present invention relates to a method of inspecting defects and circuit patterns on a sample using image obtaining means, and a device therefor.

BACKGROUND ART

In order to ensure earnings in manufacturing of semiconductor wafers, it is important that manufacturing processes thereof are quickly established to promptly shift to a mass production system at a high yield rate.

For this purpose, various inspection/measurement devices have been introduced in a production line. In order to promptly determine process conditions under which desired circuit patterns can be formed, for example, process conditions are intentionally changed to produce plural wafers or chips for inspection at the stage of process establishment, and are determined on the basis of the inspection result. On the other hand, wafers at the stage of mass production are inspected for the purpose of process monitoring. Namely, a wafer sampling inspection is performed during wafer production to check occurrence of defects on the surface of each wafer or to check circuit patterns formed on the surface of each wafer for abnormalities. In the case where defects or abnormalities of circuit patterns are detected as a result of the inspection, the cause is examined to take necessary measures.

As a typical inspection device used at the stage of process establishment or mass production, an optical wafer inspection device is known. For example, Japanese Patent Application Laid-Open Publication No. 2000-97869 (Patent Literature 1) discloses a technique in which an optical image of a wafer surface is captured by bright-field illumination and is compared to an image of a good-quality area (for example, an image of the adjacent chip) to inspect defects. However, such an optical inspection device is affected by the wavelength of illumination, and the resolution limitation of the obtained image becomes about several hundred nanometers. Accordingly, for defects in the order of several dozen nanometers on a wafer, only the presence or absence thereof can be detected. In the case where the defects are analyzed in detail, a defect observer with higher image-capture resolution is additionally necessary.

As a wafer inspection device other than the optical type, a scanning electron microscope (SEM)-type inspection device is known. The device performs an inspection in such a manner that an electron beam is irradiated onto an inspection area on a wafer, and an image obtained by detecting secondary electrons and the like generated therefrom is compared to an image of a good-quality area. Unlike the optical inspection device, image resolution can be increased to the order of nanometer in the SEM-type inspection device. In addition, a defect mode, such as conduction faults of contact holes exposed as electric potential on a wafer surface, that cannot be exposed in an optical image can be inspected. Japanese Patent Application Laid-Open Publication No. 2003-106829 (Patent Literature 2) describes a wafer inspection method by such an SEM-type wafer inspection device.

It is important for a defect inspection device to process in a wide range at high speeds. Thus, the amount of image data is reduced by increasing the pixel size (namely, making the resolution lower) of an image to be obtained as much as possible, and the existence of defects can be confirmed from the detected low-resolution image can be confirmed, but the types of defects cannot be identified in detail in many cases. Accordingly, an observer is used. The observer is a device by which the coordinates of defects of a wafer are captured at high resolution using outputs of an inspection device to output an image. With the advanced miniaturization in a semiconductor manufacturing process, the size of defects accordingly reaches the order of several dozen nanometers. Thus, the resolution in the order of a few nanometers is necessary to observe defects in detail.

Therefore, an observer (hereinafter, referred to as a review SEM) using a scanning electron microscope has been widely used in recent years. Automation of observing work has been desired in a semiconductor mass production line, and the review SEM is provided with an automatic defect review (ADR) function to automatically collect an image at the coordinates of defects in a sample. The coordinates of defects output from the inspection device contain errors, and the defects are detected again from an SEM image captured in a wide viewing field centering on the coordinates of defects output from the inspection device to capture the positions of the defects detected again at high resolution in the ADR.

As a method of detecting defects from the SEM image, Japanese Patent Application Laid-Open Publication No. 2001-189358 (Patent Literature 3) describes a method of detecting defects in which an image obtained by capturing a region where a defect area and the same circuit patterns are formed is used as a non-defective image, and an image obtained by capturing the defect area is compared to the non-defective image. Further, Japanese Patent Application Laid-Open Publication No. 2007-40910 (Patent Literature 4) describes a method of detecting defects from one image obtained by capturing a defect area.

Further, a pattern measurement device is used for a wafer inspection. As an example thereof, a CD-SEM (Critical-Dimension SEM: length measuring SEM) as an SEM-type pattern measurement device is known. The CD-SEM is a device for measuring the line widths of circuit patterns on a wafer at subnanometer measurement accuracy, and is particularly used for management of a semiconductor exposure process. A position to be measured, the template shapes (a line pattern, a hole pattern and the like) of circuit patterns to be measured, measurement items (a line width, a wiring pitch, the diameter of a hole pattern, and the like), and the like are registered in advance in a condition setting file referred to as a recipe. At the time of measurement, an electron beam is irradiated onto each measurement area, and secondary electrons generated therefrom are detected to obtain an image of circuit patterns of an inspection target. Then, a pattern to be measured is searched from the pattern image by pattern matching, and a processing algorithm for computing the set measurement items is applied to the searched pattern for pattern measurement. Japanese Patent Application Laid-Open publication No. 2003-59441 (Patent Literature 5) describes a pattern measurement method in the CD-SEM.

CITATION LIST

Patent Literature

Patent Literature 1: Japanese Patent Application Laid-Open Publication No. 2000-97869
Patent Literature 2: Japanese Patent Application Laid-Open Publication No. 2003-106829
Patent Literature 3: Japanese Patent Application Laid-Open Publication No. 2001-189358
Patent Literature 4: Japanese Patent Application Laid-Open Publication No. 2007-40910

Patent Literature 5: Japanese Patent Application Laid-Open Publication No. 2003-59441

SUMMARY OF INVENTION

Technical Problem

In order to improve the yield rate of semiconductor products, it is important that the cause of occurrence of fatal defects is specified to take measures. As means for specifying the cause of occurrence of fatal defects, it is important to recognize a trend of occurrence of the fatal defects in a wafer plane. However, with the miniaturization of patterns, the size of fatal defects is miniaturized. If the sensitivity of a defect inspection device is increased to detect minute defects, a manufacturing tolerance that is not originally a defect is detected, and it becomes difficult to understand a trend of occurrence of defects.

Further, with the miniaturization of semiconductor manufacturing processes, manufacturing processes become complicated, and a wide variety of defects are generated. Further, at the time of establishing a mass production line, systematic defects are likely to frequently occur due to the shapes of circuit patterns and process conditions such as exposure, etching, polishing, and the like, other than defects such as foreign substance defects that are randomly generated. The cause of occurrence of random defects is different from that of systematic defects, and thus it is important to recognize a trend of occurrence of each defect in a wafer plane by discriminating the both from each other. Further, there are plural types of systematic defects (for example, short defects, open defects, and the like). In the case where the cause of occurrence differs depending on the types of defects, it is important to recognize a trend of occurrence in a wafer plane for each type of defect. The resolution is as low as several hundred nanometers in an optical inspection device, and thus it is difficult to discriminate the types of defects at high accuracy although the positions of defects can be specified. Thus, a high-accuracy image is obtained by an observer different from an inspection device, and it is necessary to classify according to the types of defects.

Further, in order to obtain the margin of exposure conditions, a focal position and the amount of exposure at the time of exposure are changed in a wafer plane to quantify a trend of occurrence of defects or a trend of changes in the shapes of circuit patterns. These processes are performed in such a manner that defects are detected by an inspection device and the line widths are measured by the CD-SEM.

Namely, in the case where fatal defects and non-fatal defects are mixed, or in the case where there are plural defects that are different in the reason for occurrence, it is necessary to confirm the frequency or trend of occurrence of only desired defects in a wafer plane or chip plane, and to visualize a trend of changes in the shapes of circuit patterns in a wafer plane or a chip plane.

The present invention provides a method of visualizing a trend of occurrence of desired defects and a trend of changes in the various shapes of circuit patterns in a wafer plane.

Solution to Problem

In order to address the problem, an aspect of the present invention provides an inspection method for inspecting an inspection target, the method including: capturing an image of a designated area of the inspection target using image capturing means; detecting defects from the captured image; recognizing circuit patterns from the captured image; computing characteristic values related to the grey value of the image and shapes from the detected defects; computing characteristic values related to the grey value of the image and shapes from the recognized circuit patterns; extracting specific defects or circuit patterns by filtering from the detected defects and recognized circuit patterns; determining characteristic values to be mapped among the characteristic values of the specific defects or circuit patterns extracted by filtering; and displaying a distribution of the determined characteristic values on a screen in a map format.

Further, in order to address the problem, an aspect of the present invention provides a device for inspecting an inspection target, including: image capture which captures an image of a designated area of the inspection target; detector which detects defects from the captured image; recognizer which recognizes circuit patterns from the captured image; defect characteristic value computer which computes characteristic values related to the grey value of the image and shapes from the detected defects; circuit pattern characteristic value computer which computes characteristic values related to the grey value of the image and shapes from the recognized circuit patterns; extractor which extracts specific defects or circuit patterns by filtering from the defects detected by the detector and the circuit patterns recognized by the recognizer; characteristic value determiner which determines characteristic values to be mapped among the characteristic values of the specific defects or circuit patterns extracted by filtering by the extractor; and display unit which displays a distribution status of the characteristic values determined by the determiner on a screen in a map format.

Advantageous Effect of Invention

According to the present invention, in the case where fatal defects and non-fatal defects are mixed, or in the case where there are plural defects that are different in the reason for occurrence, it is possible to confirm the frequency or trend of occurrence of only desired defects in a wafer plane or a chip plane. Further, it is possible to visualize a trend of changes in the shapes of circuit patterns in a wafer plane or a chip plane.

DESCRIPTION OF EMBODIMENTS

Hereinafter, a method of inspecting defects and circuit patterns using a scanning electron microscope will be described as an embodiment according to the present invention.

First Embodiment

Figure 2:
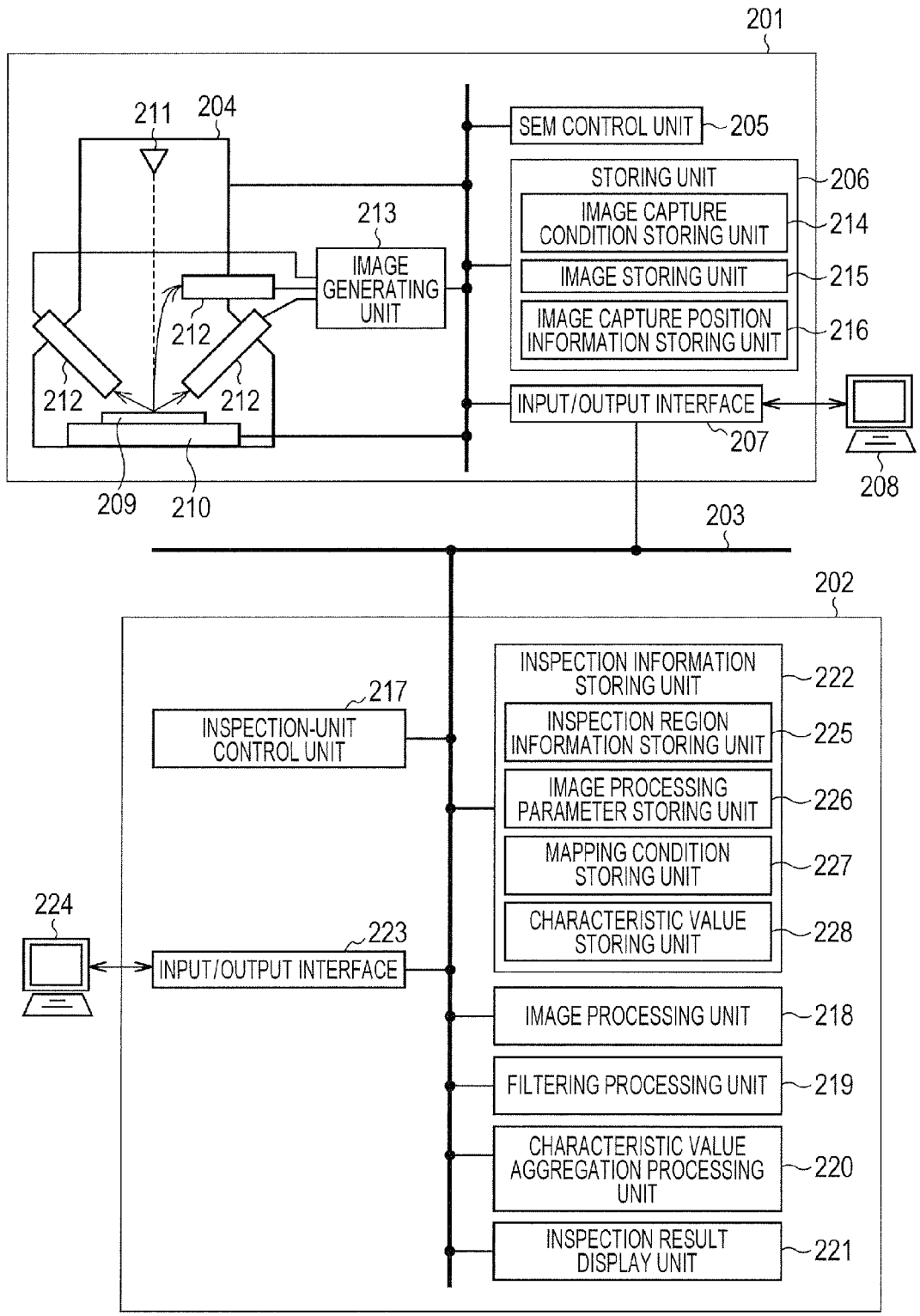
FIG. 2 is a block diagram for showing an outline configuration of an inspection device according to the first embodiment.

FIG. 2 shows a configuration diagram of an inspection device according to the present invention. In the device, an SEM 201 is connected to an inspection unit 202 via communication means 203. The SEM 201 includes an electronic optical system column 204, an SEM control unit 205, a storing unit 206, an input/output interface 207, and an input/output terminal 208.

Further, the electronic optical system column 204 includes, in addition to a movable stage 210 that can be moved in an X-Y plane while mounting a sample wafer 209 thereon, an electron source 211 for irradiating an electron beam onto the sample wafer 209, and detectors 212 for detecting secondary electrons and reflection electrons generated from the sample wafer, a deflector (not shown) for allowing an electron beam to scan on the sample wafer, and an image generating unit 213 that converts a signal from the detector 212 into a digital signal to generate a digital image.

The storing unit 206 includes an image capture condition storing unit 214 that stores accelerating voltage, probe current, and an image capture viewing field size as image capture conditions of the SEM, an image storing unit 215 that saves obtained image data, and an image capture position information storing unit 216 that stores position information where the image was captured.

The SEM control unit 205 is a unit to control processes of the SEM 201 such as obtaining an image. On the basis of an instruction from the SEM control unit 205, the movable stage 210 is moved to allow a predetermined inspection area on the sample wafer 209 to be placed within an image capture viewing field, an electron beam is irradiated onto the sample wafer 209, and data detected by the detectors 212 is converted into an image to be saved into the image storing unit 215. Through the input/output terminal 208 configured using a keyboard, a mouse, a display, and the like, various instructions are issued and image capture conditions are designated by an operator.

The inspection unit 202 is a unit to perform an inspection process for the captured image obtained by capturing the sample wafer 209 with SEM 201. The inspection unit 202 includes an inspection-unit control unit 217 that controls the entire inspection unit 202, an image processing unit 218 that performs various operations for an image to compute characteristic values, a filtering processing unit 219 that extracts a specific pattern from the computed characteristic values, a characteristic value aggregation processing unit 220 that aggregates the computed characteristic values, an inspection result display unit 221 that produces and displays a wafer map on the basis of the aggregated characteristic values, an inspection information storing unit 222 that stores various information necessary for the inspection process, an input/output interface 223 that has an interface function for sending and receiving data to/from the SEM-side, and an input/output terminal 224 by which conditions of various processes performed by the inspection unit 202 are input and an inspection result is displayed.

The inspection information storing unit 222 includes an inspection region information storing unit 225 that stores a non-defective image necessary for the inspection process and information of the inspection region associated with the non-defective image, an image processing parameter storing unit 226 that stores various parameters necessary when performing operations for an image, a mapping condition storing unit 227 that stores filtering conditions for extracting a specific pattern from detected patterns and aggregating conditions of characteristic values necessary to generate a wafer map, and a characteristic value storing unit 228 that stores the computed characteristic values. Next, an inspection method using the inspection device shown in FIG. 2 will be described.

In the first place, an outline of the inspection method according to the present invention will be described using FIG. 1A.

First, an SEM image of the sample wafer 209 is obtained by the SEM 201 (S11). Next, the obtained SEM image is processed by the inspection unit 202 to detect defects (S12), and recognize circuit patterns in the SEM image (S13). The defect detection process and the circuit pattern recognition process may be performed sequentially or in parallel. FIG. 1A shows a case of the parallel processing. Next, a filtering process is performed for the detected defect image and circuit pattern image to classify the defects and circuit patterns (S14), and characteristic values are computed from the desired defect or circuit pattern image (S15). A map is displayed based on the computed result (S16), and the process is completed.

Next, the processing flow described in FIG. 1A will be described in detail using FIG. 1B. In the first place, the process corresponding to that of obtaining an SEM image (S11) described in FIG. 1A will be described in detail. The sample wafer 209 as an inspection target is set on the stage 210 (S101). Next, an image capture area of the inspection target wafer 209 is designated (S102). The image capture area is generally referred to as a risk point. The risk point is susceptible to exposure conditions at the time of forming a circuit pattern and changes in process conditions, and the like, and is a point at which defects causing chip faults are likely to occur. The risk point can be predicted by a process simulator or the like. The image capture area may be designated as a point predicted to have a risk by the process simulator, or may be designated as a point assumed to have a risk from the experience of a user. Further, the image capture area may be arbitrarily designated other than the risk point.

Figure 3:
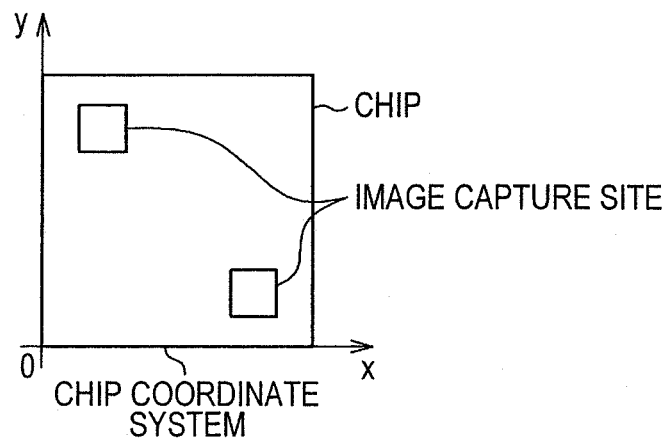
FIG. 3 is a coordinate system for showing an example of an image capture area designating method.
Figure 4:
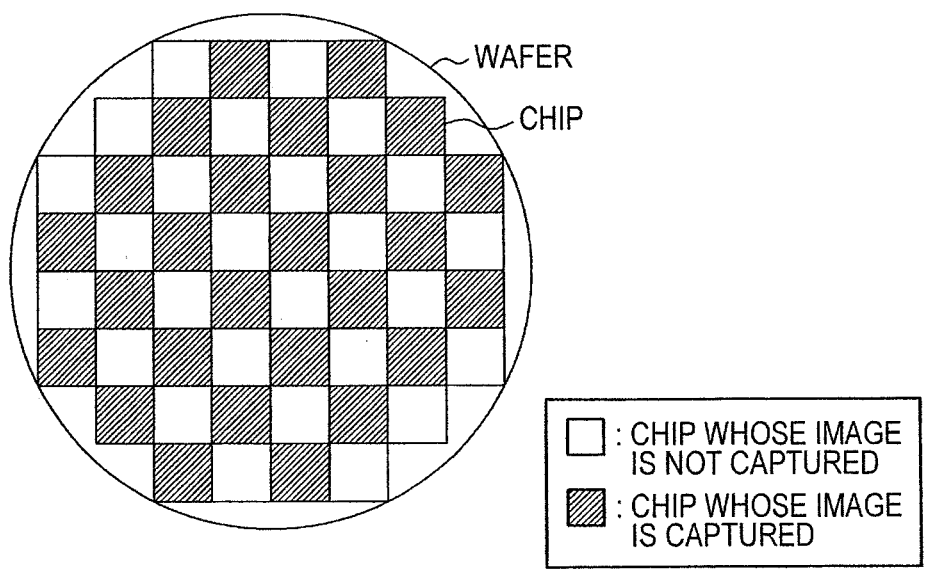
FIG. 4 is a plan view of a wafer for showing an example of the image capture area designating method according to the first embodiment.

It should be noted that since a plurality of the same circuit patterns are formed in every chips on a semiconductor wafer, in case an object of the inspection is to evaluate occurrence of defects in the wafer and changes in shapes of the circuit patterns, it is not always necessary to inspect all the chips. Therefore, coordinates to be used in image capturing are represented as chip coordinates as shown in FIG. 3, and chips whose images are captured may be selected as shown in FIG. 4.

Next, an SEM image at a designated area is obtained by the SEM 201 (S103). The SEM control unit 205 reads image capture conditions (for example, accelerating voltage, probe current, and the number of additional frames) from the image capture condition storing unit 214 to control the stage 210 to the position where an image of the designated area can be captured. Then, an electron beam irradiated from an electron gun 211 is allowed to scan in an image capture viewing field, and secondary electrons and reflection electrons generated from the sample 209 are detected by the detectors 212. Thereafter, analog signals output from the detectors 212 are converted into digital signals by the image generating unit 213 and the image is saved into the image storing unit 215.

It should be noted that a few micron meters of movement errors of the stage 210 occur, and thus there is a problem that the designated area is different from the area whose image is actually captured. In order to address the problem, as described in Patent Literature 5, an image of the designated area may be captured by beam shifting after an image of a predetermined unique circuit pattern existing around the designated area is captured and is aligned by pattern matching.

Figure 5:
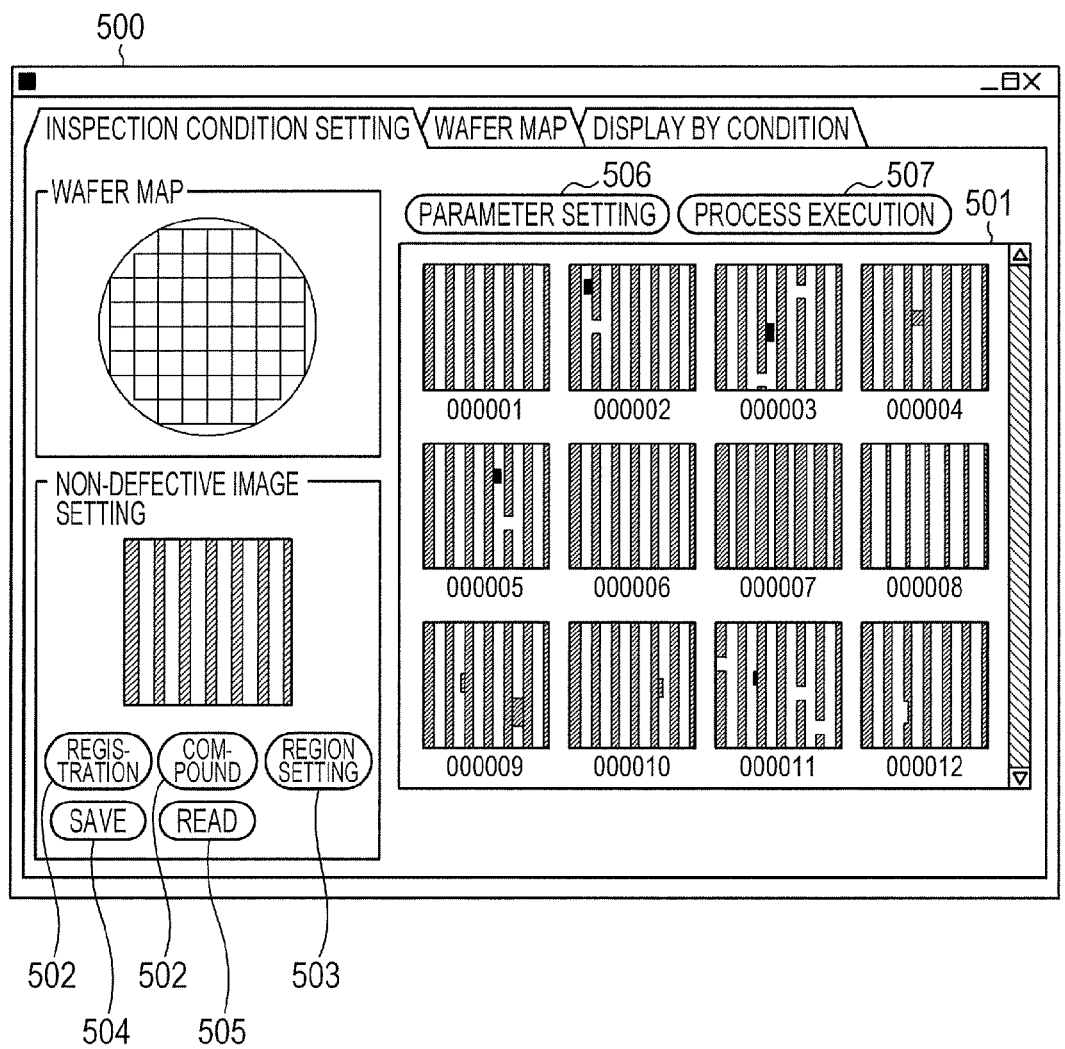
FIG. 5 is a front view of an inspection condition setting screen according to the first embodiment.

After the image obtaining is completed, the obtained image is processed to perform inspection by the inspection unit 202. The inspection-unit control unit 217 obtains the image captured by the SEM 201 through the input/output interface 223, and the obtained image is displayed on the input/output terminal 224. FIG. 5 shows a GUI 500 (hereinafter, described as an inspection condition setting GUI 500) for designating inspection conditions, and includes an obtained image display region 501 in which a list of obtained images is displayed.

Next, among plural captured images displayed in the obtained image display region 501 of the inspection condition setting GUI 500, a non-defective image is designated (S104). The non-defective image is used to detect defects from the captured image of the object to be inspected by comparison inspection. Thus, the non-defective image should be an image in which patterns are formed as expected, and no defects are contained. In a general inspection at a mass production line after a manufacturing process is established, it is conceivable that a non-defective image is included in the captured images. For example, a circuit pattern is correctly formed at the central part of a wafer. However, in the case where the focus point is deviated in the exposure process due to the effects of the warpage of the wafer and the pattern becomes thinner at the outer periphery of the wafer, the captured image of the central part of the wafer may be designated as a non-defective image. In this case, the non-defective image is selected from the list of images of the inspection condition setting GUI, and a registration button 502 is clicked to complete the designation.

The above description is a case in which there is an ideal area (an area at which no defects are contained and a pattern is normally formed) of the wafer plane in the captured non-defective image. However, there is no ideal image capture area in some cases, such as when establishing a mass production line or providing process conditions.

In such a case, a non-defective image is produced by compounding from plural captured images to enable the inspection. Plural images used in composition are selected from the list of images of the inspection condition setting GUI, and a compound button 502 is clicked, so that a composition process is executed. At the time of composition, images with the same layout of circuit patterns are used. If coordinates in chips are the same in a semiconductor wafer, the layout of circuit patterns is the same. Thus, it is only necessary to perform the composition process for each coordinate in the chip.

Figure 6:
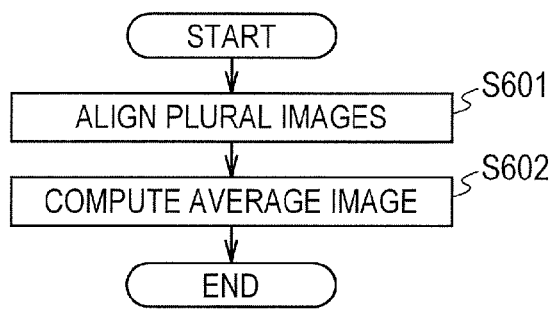
FIG. 6 is a flow diagram of a non-defective image producing process according to the first embodiment.

A flow of the composition process is shown in FIG. 6. In the first place, plural images are aligned (S601). The stage is moved to the designated area in the SEM 201 to measure stage movement errors, and a scanning range of the electron beam is determined on the basis of the measured result to obtain an image. Thus, high-accuracy positioning can be performed. However, it is general that image capture positions are slightly different between the images due to errors occurring when measuring the stage movement errors. Accordingly, alignment is performed by an image process in which the circuit patterns in the images are overlapped.

Next, an average image with an average gray value is produced from plural images (S602). The average value of each pixel is computed, so that the gray value at a defect area is averaged by pixels at a normal area and an image in which defects are not exposed can be produced. Further, the non-defective image can be stored, as a new name, into the image storing unit 215 by clicking a save button 504, and can be read from the image storing unit 215 by clicking a read button 505 while designating the name. Accordingly, an image captured on a different wafer can be designated as a non-defective image.

Figure 7:
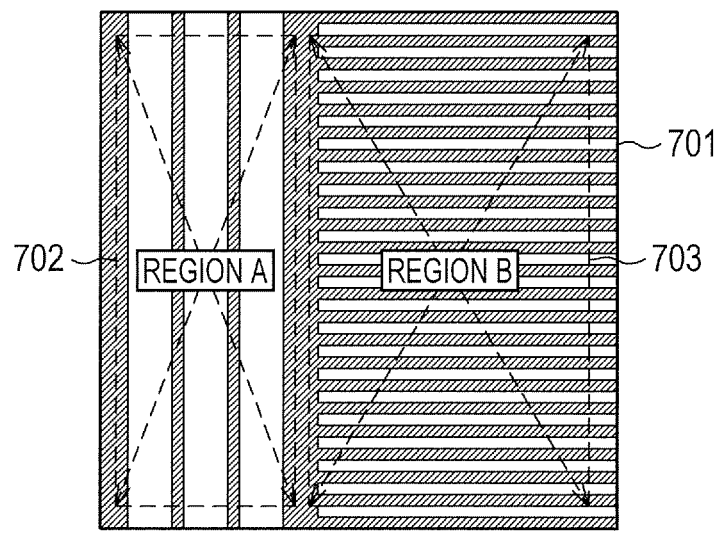
FIG. 7 is an enlarged view of a chip for showing a setting example of an inspection region according to the first embodiment.

Next, inspection region information is set (S105). The inspection region information is information of a region that is defined in a viewing field of the non-defective image by a user, and is used as conditions at the time of filtering. FIG. 7 shows a setting example of the inspection region information. In the example of FIG. 7, a non-defective image 701 contains circuit patterns with different structures in the vertical and horizontal directions. In the case where, for example, it has been found that the reasons for occurrence of the defects are different depending on the circuit patterns in the vertical and horizontal directions, it is important to produce a wafer map in which the number of defects is plotted in accordance with the direction of the circuit pattern.

Figure 8:
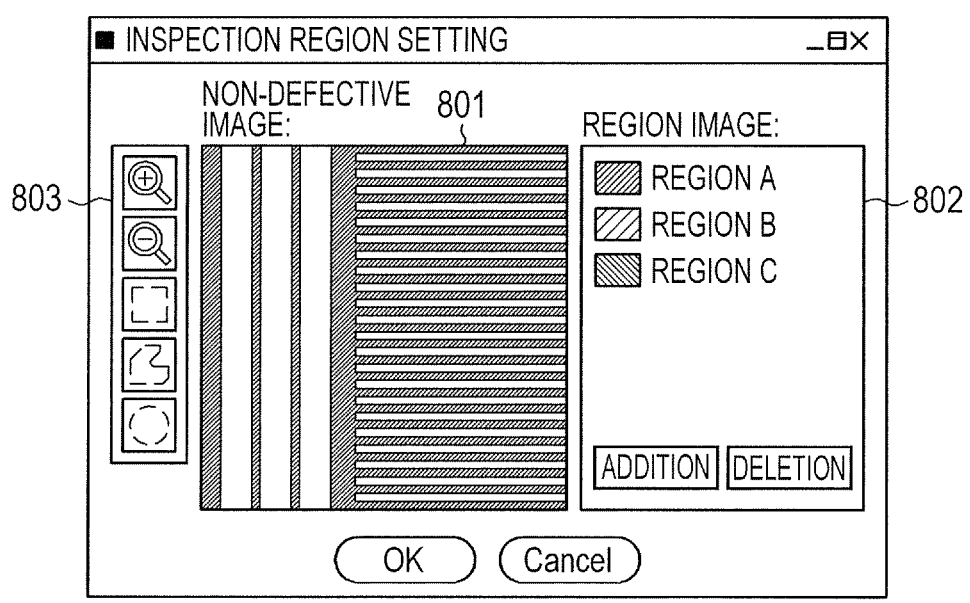
FIG. 8 is a front view of an inspection region setting screen according to the first embodiment.

Accordingly, in the case where a region A (702) is set at the circuit pattern region in the vertical direction and a region B (703) is set at the circuit pattern region in the horizontal direction as shown in FIG. 7, only the defects of the region A (702) and the region B (703) can be extracted if a filtering process, to be described later, is used. A GUI for setting the inspection region information is shown in FIG. 8. The GUI is called by clicking a region setting button 503 of the inspection condition setting GUI (FIG. 5).

The GUI is configured using an interface 801 for displaying the non-defective image set in S104, an interface 802 for adding or deleting the region information, and various tool buttons 803 for defining the regions. A user selects an appropriate shape setting tool from the tool buttons in accordance with the shape of the region to be defined, and defines the region by designating coordinates on the non-defective image using a mouse or the like. It should be noted that a method of defining the region may be one other than focusing attention on the directions of the circuit patterns. For example, a memory cell part and a logic part may be separately designated, or a pattern region for a test or a dummy pattern region may be designated.

Figure 9:
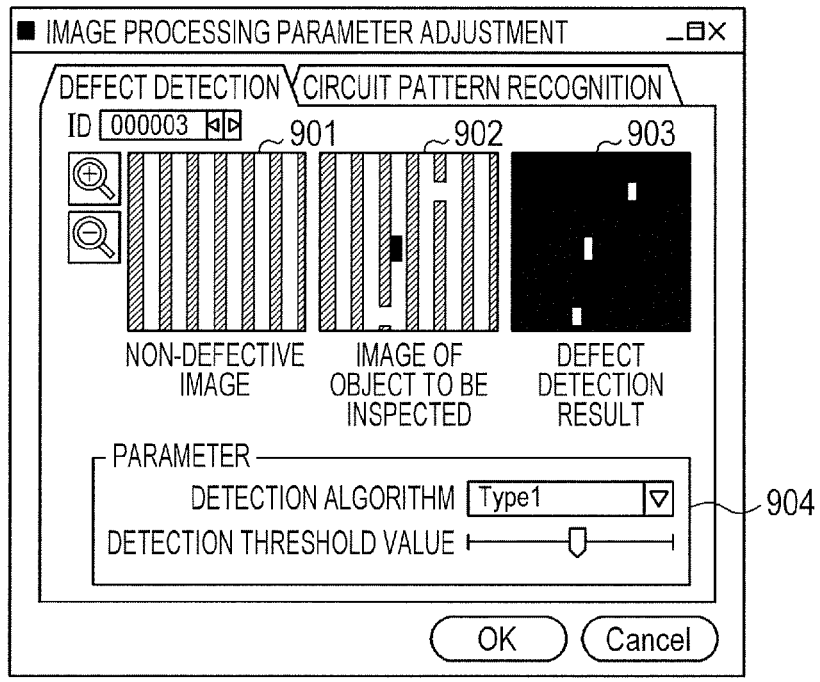
FIG. 9 is a front view of a parameter setting screen of a defect detection process according to the first embodiment.
Figure 10:
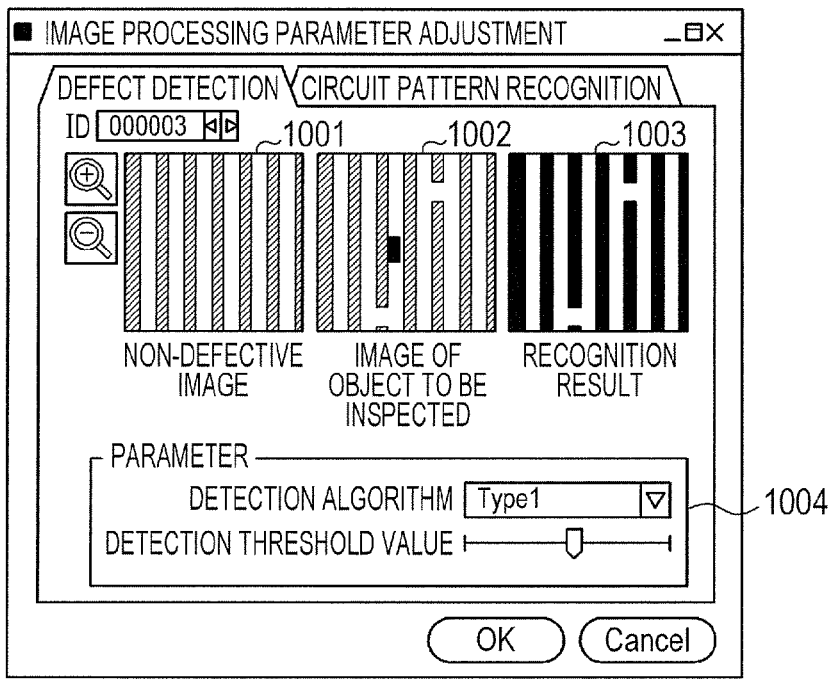
FIG. 10 is a front view of a parameter setting screen of a circuit pattern recognition process according to the first embodiment.

Next, image processing parameters for "defect detection" and "circuit pattern recognition" are set and adjusted (S106). Each of FIG. 9 and FIG. 10 shows a GUI for adjusting the image processing parameters, and is displayed by clicking a parameter setting button 506 on the inspection condition setting GUI (FIG. 5). Parameter adjustment screens related to "defect detection" and "circuit pattern recognition" can be switched and displayed by using tabs on the image processing parameter adjustment GUI, and FIG. 9 shows a state in which the tab for the parameter adjustment screen related to "defect detection" is being selected. The defect detection parameter adjustment screen includes interfaces (901 to 903) for displaying a non-defective image, an inspected image, and an image of a defect detection result, and an interface 904 for changing a defect detection algorithm or adjusting the value of the parameter.

In FIG. 9, regions extracted as defects are displayed using white as the defect detection result. It should be noted that regions detected as defects on the inspected image may be highlighted by changing the display color thereof. Further, in the case where the defect detection algorithm or the value of the parameter is adjusted, a defect detection process may be executed to reflect the result on the display of the GUI. Accordingly, the result of adjusting the parameter can be confirmed in real-time, and the parameter can be easily adjusted.

FIG. 10 shows a state in which the tab for the parameter adjustment screen related to "circuit pattern recognition" is being selected among the image processing parameter adjustment screens. As similar to the parameter adjustment screen of "defect detection", provided are interfaces (1001 to 1003) for displaying a non-defective image, an inspected image, and an image of a circuit pattern recognition result, and an interface 1004 for changing a circuit pattern recognition algorithm and adjusting the value of the parameter.

In FIG. 10, circuit pattern regions recognized as a result of recognizing a circuit pattern are displayed using white, and base regions are displayed using black. Further, in the case where the circuit pattern recognition algorithm or the value of the parameter is adjusted, a circuit pattern recognition process may be executed to reflect the result on the display of the GUI. Information of the values of the parameters related to "defect detection" and the "circuit pattern recognition" process set as described above and the selected algorithm is stored in the image processing parameter storing unit 226.

Next, the processes corresponding to the defect detection (S12) and the circuit pattern recognition (S13) described in FIG. 1A will be described in detail.

When a process execution button 507 on the inspection condition setting GUI 500 shown in FIG. 5 is clicked, a defect detection process (S107), a circuit pattern recognition process (S108), a defect characteristic value computing process (S109), and a circuit pattern characteristic value computing process (S110) are executed for the inspected image by the image processing unit 218. In this case, the defect detection process (S107) and the circuit pattern recognition process (S108) are independently executed. Thus, these processes may be executed in parallel. The processing time can be shortened by executing in parallel.

The defect detection process (S107) is a process in which defect areas are detected from the inspected image of the sample wafer 209 obtained by the SEM 201. As a method of detecting defects, a method of detecting defect areas by comparing a non-defective image and an inspected image to each other may be used. As an example of the comparison method, Patent Literature 3 describes an example in which a difference between a non-defective image and an inspected image is calculated after being aligned, and regions where the value of the difference is a certain value or larger are detected as defects. Further, defects may be detected from one inspected image without using the non-defective image. As an example of the method, Patent Literature 4 describes an example of detecting defects in which the repeated periodicity of circuit patterns contained in an inspected image is used to estimate a non-defective image.

The circuit pattern recognition process (S108) is a process in which circuit patterns are detected from the non-defective image and the inspected image. The circuit patterns in this case mean structures configured on a semiconductor wafer, such as wirings, holes, and semiconductor elements. As a method of recognizing the circuit patterns, the following methods may be used. An area where a grey value is drastically changed in an image is extracted as the outline of a circuit pattern, and an inner region of the circuit pattern is specified and recognized on the basis of the grey value and the changing direction thereof. Alternatively, a region of a circuit pattern is recognized on the basis of a grey value in an image. Further, a circuit pattern in an image may be recognized using design information in which layout information of the circuit pattern of a semiconductor product as an inspection target is described.

Next, characteristic values related to the brightness, shape, position, and the like of each of the detected defects and the recognized circuit patterns are computed (S109 and S110).

Figure 11:
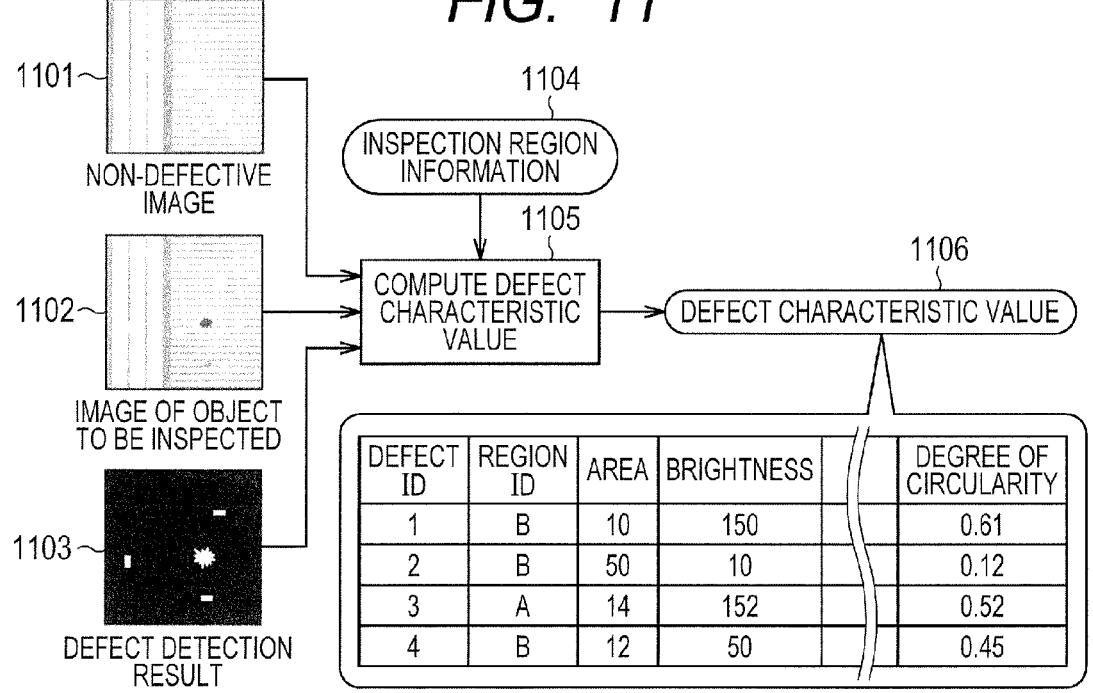
FIG. 11 is a flow diagram of a characteristic value computing process of a defect area according to the first embodiment.

FIG. 11 shows a method of computing the defect characteristic values (S109). In the defect characteristic value computing process, a non-defective image 1101, an inspected image 1102, a defect detection result, and inspection region information 1104 set in S104 are input to compute the characteristic values of each of the detected defects (1105). In the example of FIG. 11, four defects are detected, and the characteristic values of each defect are computed (1106).

Figure 12:
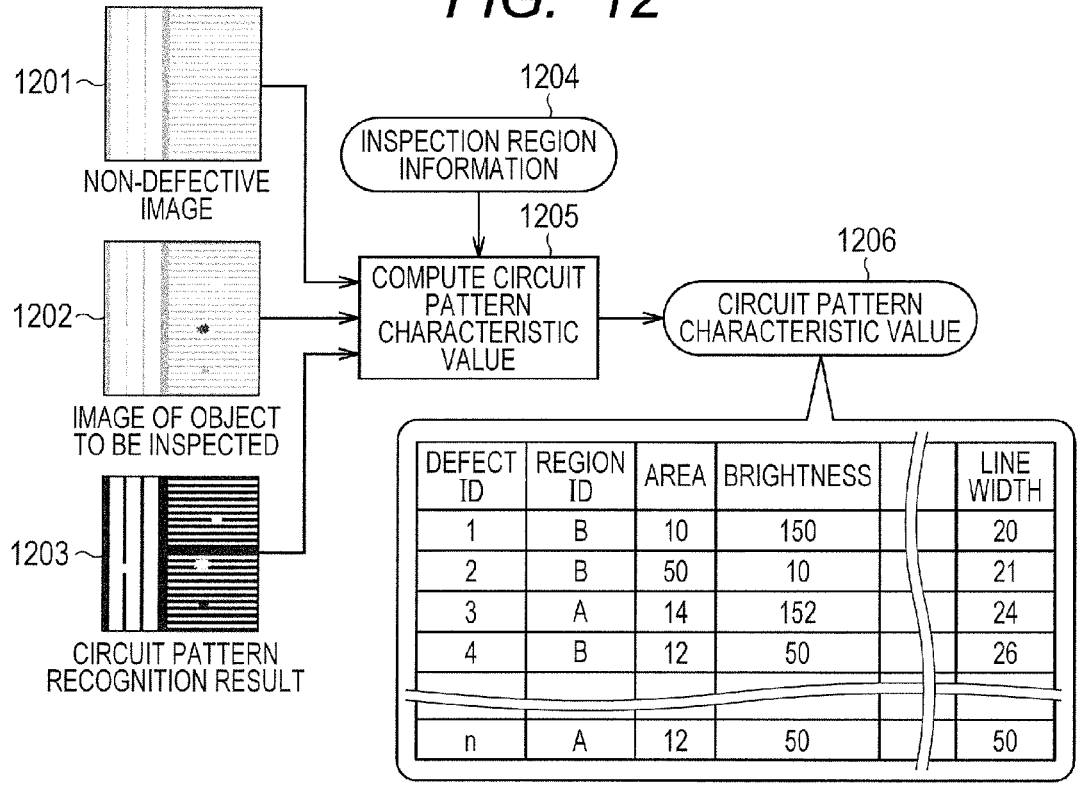
FIG. 12 is a flow diagram of a characteristic value computing process of a circuit pattern according to the first embodiment.

FIG. 12 shows a method of computing the circuit pattern characteristic values (S110). As similar to the defect characteristic value computing process, a non-defective image 1201, an inspected image 1202, a circuit pattern recognition result 1203, and inspection region information 1204 are input to compute the characteristic values of each of the recognized circuit patterns (1205). For example, in the case where n circuit patterns are extracted, the characteristic values of each of the n circuit patterns are computed (1206). It should be noted that the types of characteristic values computed in the defect characteristic value computing process and the circuit pattern characteristic value computing process may be different from each other.

Figure 13:
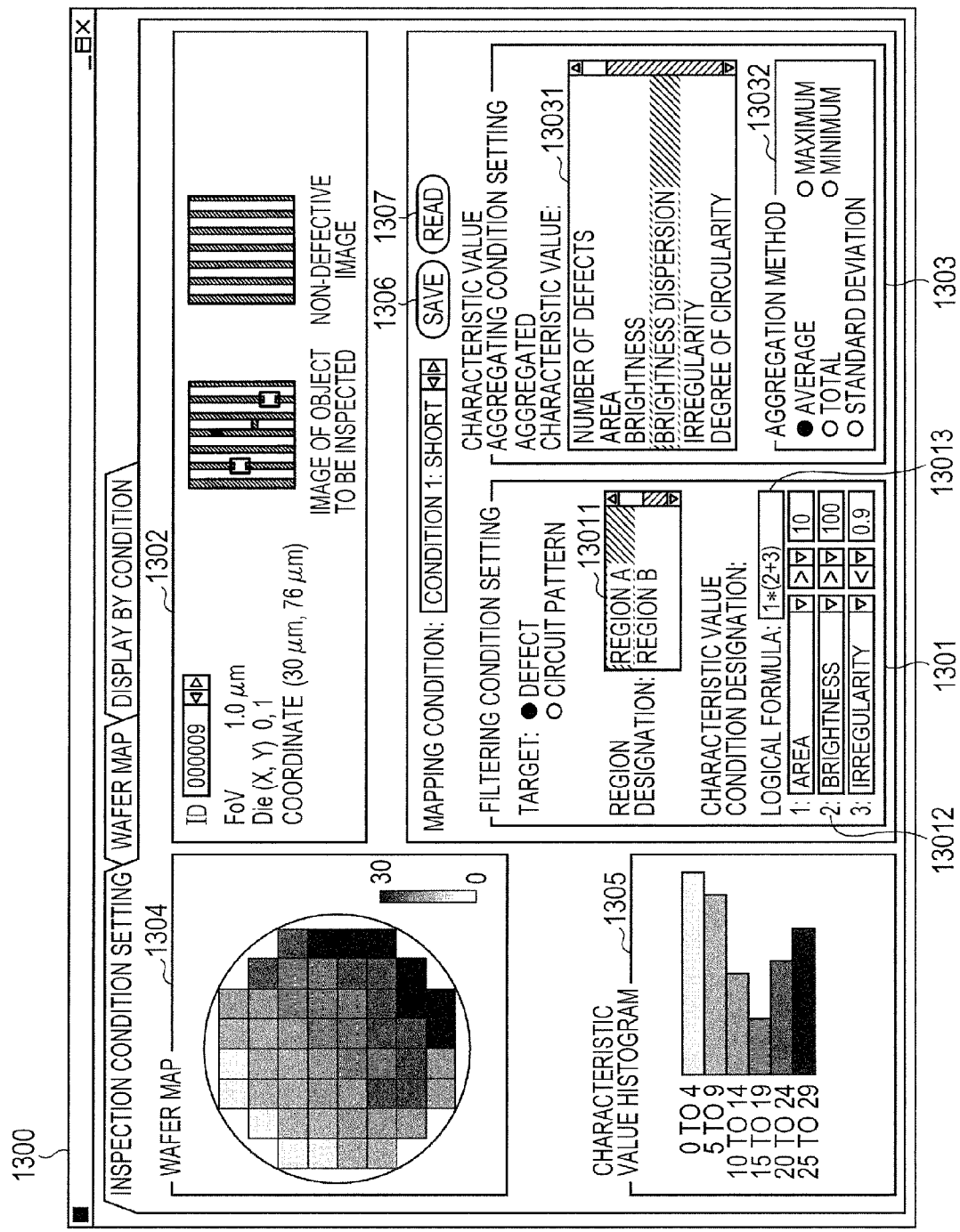
FIG. 13 is a front view of a mapping condition designation screen according to the first embodiment.

Next, filtering conditions and characteristic value aggregating conditions are set on a wafer map GUI 1300 shown in FIG. 13 (S111 to S116) to produce a wafer map. The GUI 1300 includes an interface 1301 for setting the filtering conditions, an interface 1302 for confirming a filtering result, an interface 1303 for setting the characteristic value aggregating conditions, an interface 1304 for displaying the produced wafer map, and an interface 1305 for displaying a histogram of the aggregated characteristic values. Further, both of the set filtering conditions and characteristic value aggregating conditions are used as mapping conditions, and the mapping conditions are saved, as a new name, into the storing unit by clicking a save button 1306. Then, the saved mapping conditions can be read by clicking a read button 1307 while designating the name.

Next, the process corresponding to the filtering (S14) described in FIG. 1A will be described in detail.

In the first place, filtering conditions are set (S111). The filtering is performed to extract only specific defects or circuit patterns from the plural types of defects and circuit patterns contained in an image. For example, in the case where short defects and open defects are mixed in an image and the reasons for occurrence of the defects are different, it is important to separately aggregate the numbers. Accordingly, for example, only the open defects are extracted by the filtering, and a trend of occurrence of the defects in the wafer can be confirmed. On the filtering condition setting interface 1301, "defect" or "circuit pattern" is selected as the designation of the filtering conditions.

Next, conditions for the computed characteristic values are designated. As a method thereof, for example, one or more condition expressions are set for the characteristic values, and a method of combining the conditions may be set. For example, in the case where only the short defects are to be extracted, conditions such as "the number of adjacent circuit patterns ≥2" and "the brightness of the defect part=the brightness of the circuit pattern" may be set.

The filtering conditions are set by combining the plural condition expressions as described above. Thus, the interface 1301 for setting the filtering conditions includes an interface 13011 for designating the inspection region set in S104, an interface 13012 for defining the condition expressions for the characteristic values, and an interface 13013 for defining the method of combining the defined condition expressions using a logical expression.

It should be noted that other than the method of combining the conditions for each of the characteristic values, filtering may be performed by a method of setting a threshold value for each of characteristic values represented by the linear sum of the characteristic values, or filtering may be performed by setting a non-linear identifying plane in a characteristic value space with each characteristic value used as a base. Further, in the case where the filtering conditions are set or changed, the inspection-unit control unit 217 uses the filtering processing unit 219 to determine whether or not each of the extracted defects or circuit patterns matches the conditions (S112).

The inspection-unit control unit 217 reflects the result on the filtering result confirmation interface 1302 of the GUI 1300. As a method of displaying the filtering result, the defects or circuit patterns extracted by the filtering may be highlighted with frames, or the defects or circuit patterns that are extracted and the defects or circuit patterns that are not extracted may be displayed using different colors. Accordingly, the filtering conditions can be set while checking the result, and the conditions can be easily set.

Next, the process corresponding to the characteristic value computation/aggregation (S15) described in FIG. 1A will be described in detail.

In the first place, the aggregating conditions of the characteristic values are set (S113). The aggregation of the characteristic values is a process in which the characteristic values displayed on the wafer map 1304 are computed from the characteristic values of the defects or circuit patterns extracted by the filtering. In the defect characteristic value computing step S109 or the circuit pattern characteristic value computing step S110 described above, the characteristic values are computed for each of the extracted defects and circuit patterns. However, it is occasionally necessary to compute the characteristic values for one chip when displaying on the wafer map 1304, and it is necessary to compute the characteristic values to be mapped from plural defects or circuit patterns in one chip.

Figure 18:
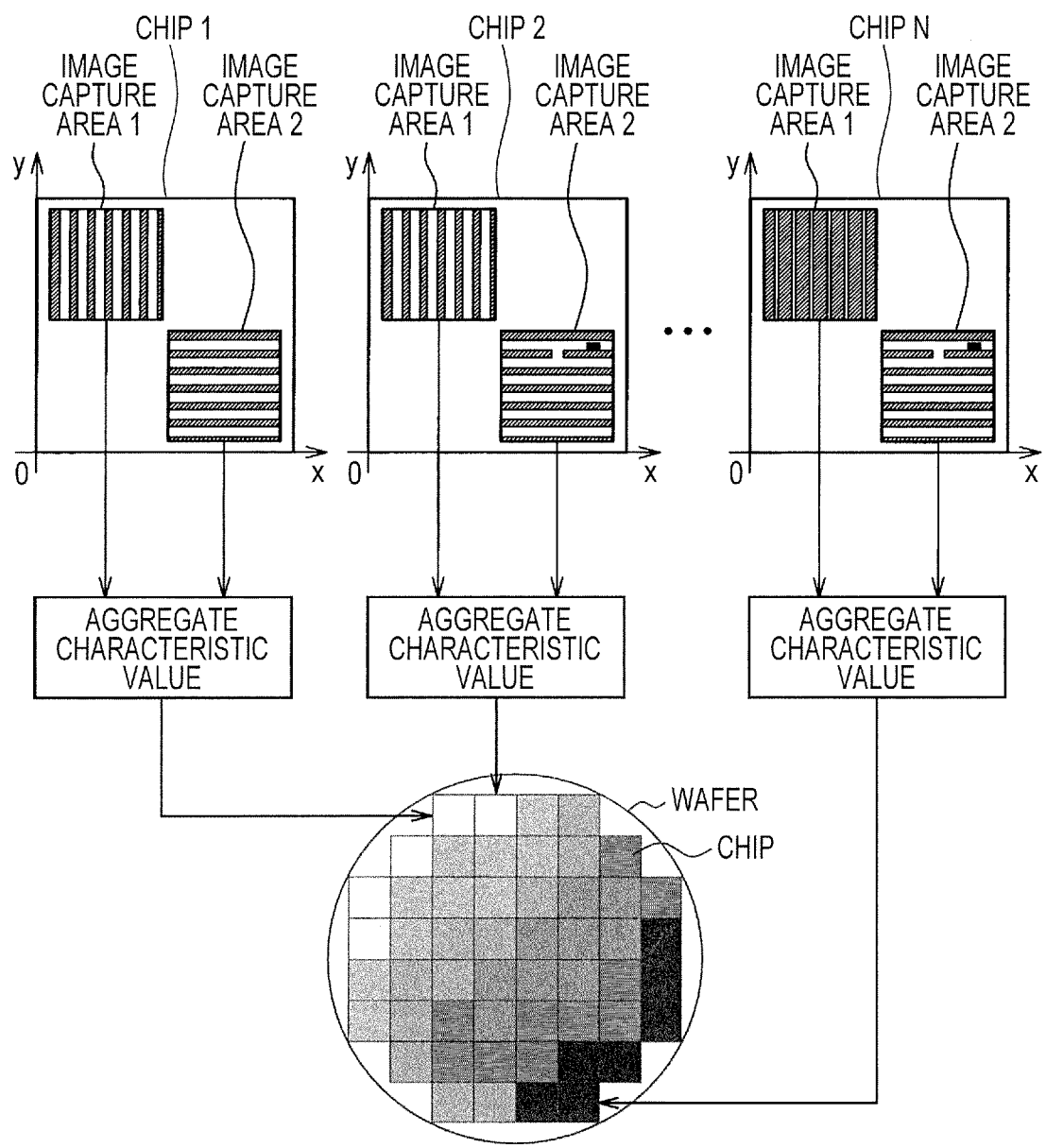
FIG. 18 is a flow diagram of a characteristic value aggregation process according to the first embodiment.

The aggregating conditions of the characteristic values are set on the interface 1303 for setting characteristic value aggregating conditions. First, as aggregation characteristic values 13031, characteristic values to be mapped are set among the computed characteristic values. Next, as an aggregation method 13032, one of "average/total/standard deviation/maximum value/minimum value" is selected. For example, in the case where the average line width of the circuit patterns in the plane is to be computed, "line width" may be selected as the aggregation characteristic values 13031, and "average" may be selected as the aggregation method 13032. Further, if "standard deviation" is selected as the aggregation method 13032, variations in the line widths of the circuit patterns in the plane can be displayed on the wafer map 1304. In the case where the characteristic value aggregating conditions 13031 are set or changed, the inspection-unit control unit 217 uses the characteristic value aggregation processing unit 220 to compute the characteristic values for each chip as shown in FIG. 18 from the computed characteristic values on the basis of the set characteristic value aggregating conditions (S114). The computed characteristic values are saved in the characteristic value storing unit 228 (S115) to be used for display of the wafer map 1304 (S116).

Figure 14:
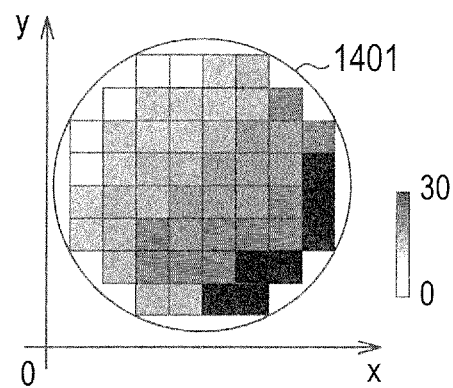
FIG. 14 is a front view of a part of a screen for showing an example of a display method of an inspection result according to the first embodiment.
Figure 15:
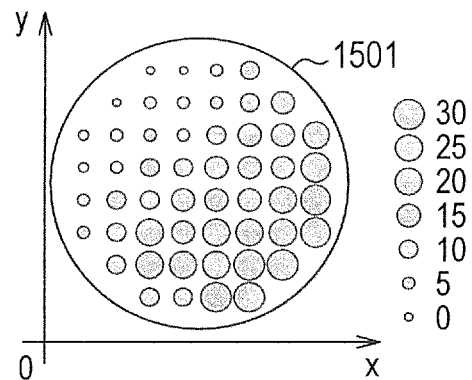
FIG. 15 is a front view of a part of a screen for showing an example of a display method of an inspection result according to the first embodiment.
Figure 16:
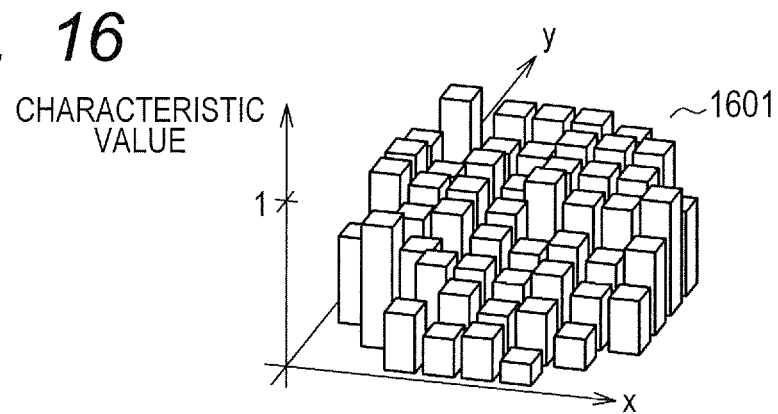
FIG. 16 is a front view of a part of a screen for showing an example of a display method of an inspection result according to the first embodiment.

When the characteristic value aggregation process (S114) is completed, display of the wafer map 1304 and the characteristic value histogram 1305 in FIG. 13 is updated. The wafer map 1304 is used to express the magnitudes of the characteristic values. For example, the magnitudes may be represented by changing a display color 1401 as shown in FIG. 14, by changing the size 1501 of a drawing as shown in FIG. 15, or by using a three-dimensional graph as shown in FIG. 16.

If the characteristic value aggregation process (S114) is finished and the update of the display of the wafer map 1304 and the characteristic value histogram 1305 is completed, the wafer as an inspection target is unloaded (S117) to complete a series of operations.

Figure 17:
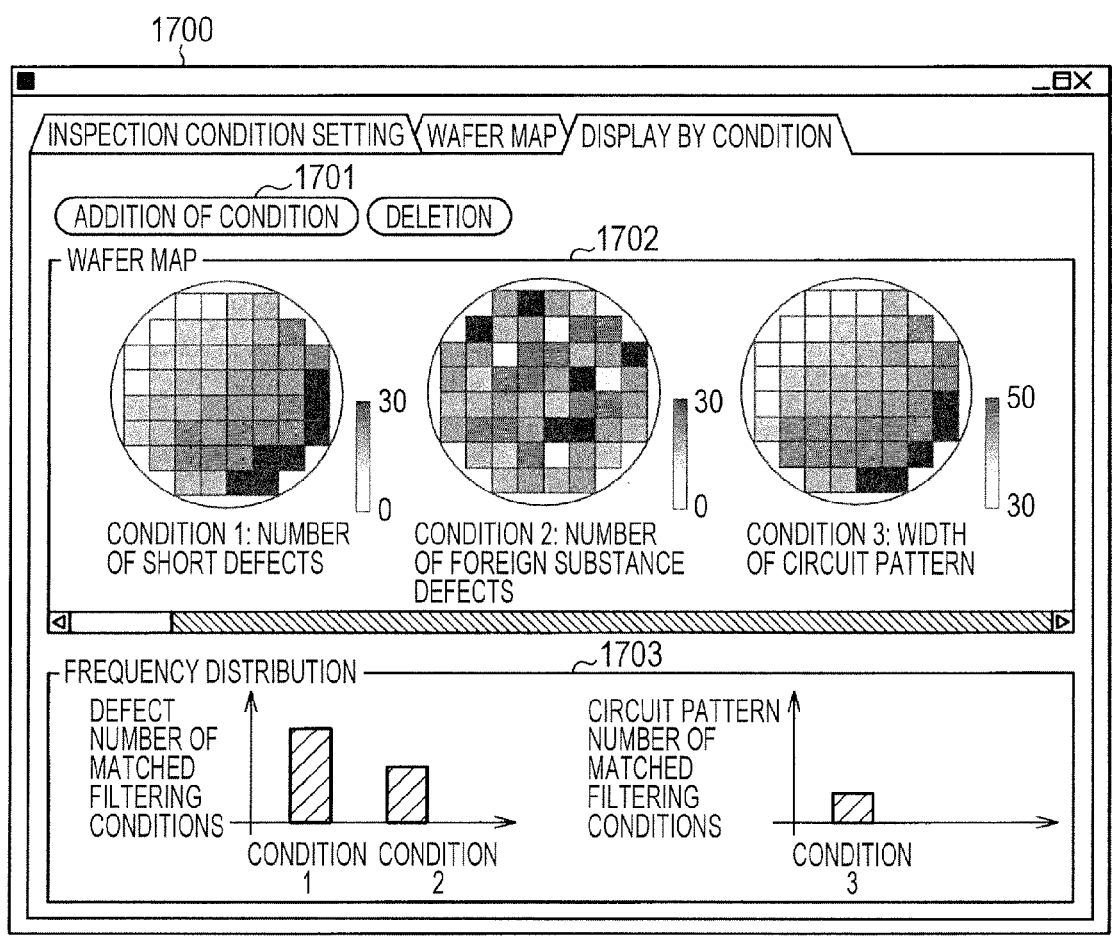
FIG. 17 is a front view of a part of a screen for showing an example of a display method of an inspection result according to the first embodiment.

Further, the inspection device according to the present invention includes a display-by-condition GUI 1700 for displaying on the input/output terminal 224 the aligned wafer maps produced under plural mapping conditions (FIG. 17). If an addition-of-condition button 1701 on the display-by-condition GUI 1700 is clicked and the name of the saved mapping conditions is selected, the corresponding mapping conditions are read to produce a wafer map, and a list of wafer maps is displayed on an interface 1702. Further, the GUI 1700 includes an interface 1703 for comparing the number of defects or circuit patterns matching the filtering conditions under different mapping conditions to be displayed. Thus, for example, the numbers of short defects and foreign substance defects can be compared to each other.

In the embodiment, there has been described a method in which defects or circuit patterns are extracted from a captured image, the characteristic values thereof are computed, only the defects or circuit patterns designated by a user are extracted by a filtering process, and the characteristic values designated by the user are displayed on a wafer map.

Second Embodiment

In the first embodiment, there has been described the inspection method in which the characteristic values are displayed on the wafer map as an inspection result. In the second embodiment, there will be described an inspection method in which a trend of changes relative to the number of generated defects and the shapes of circuit patterns in a chip is visualized by mapping the characteristic values for each image capture area in the chip as shown in FIG. 19.

Figure 1A:
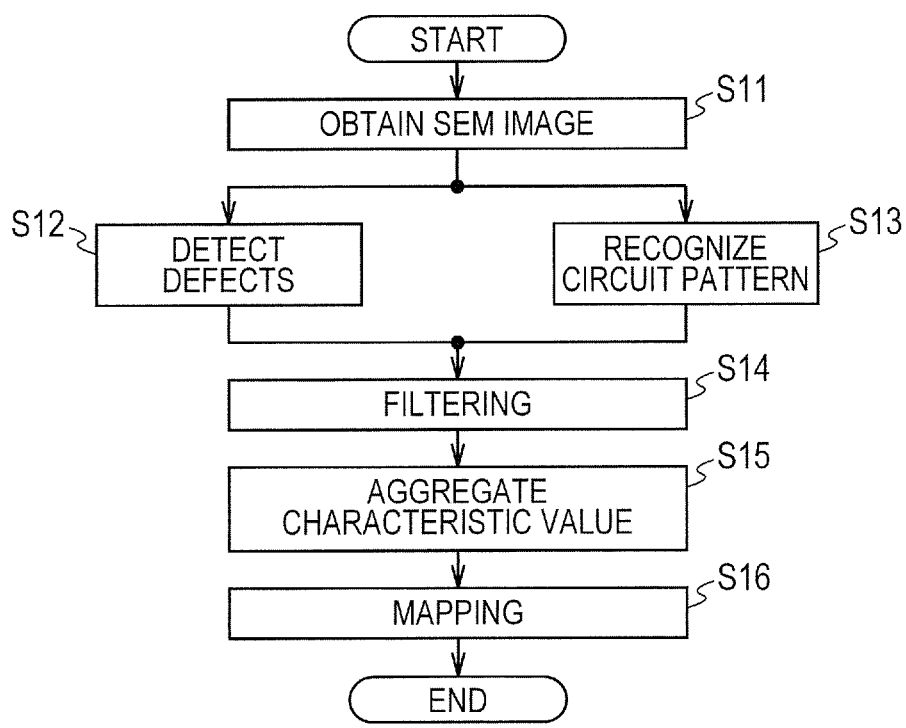
FIG. 1A is a flow diagram for showing an outline flow of an inspection process according to a first embodiment.
Figure 1B:
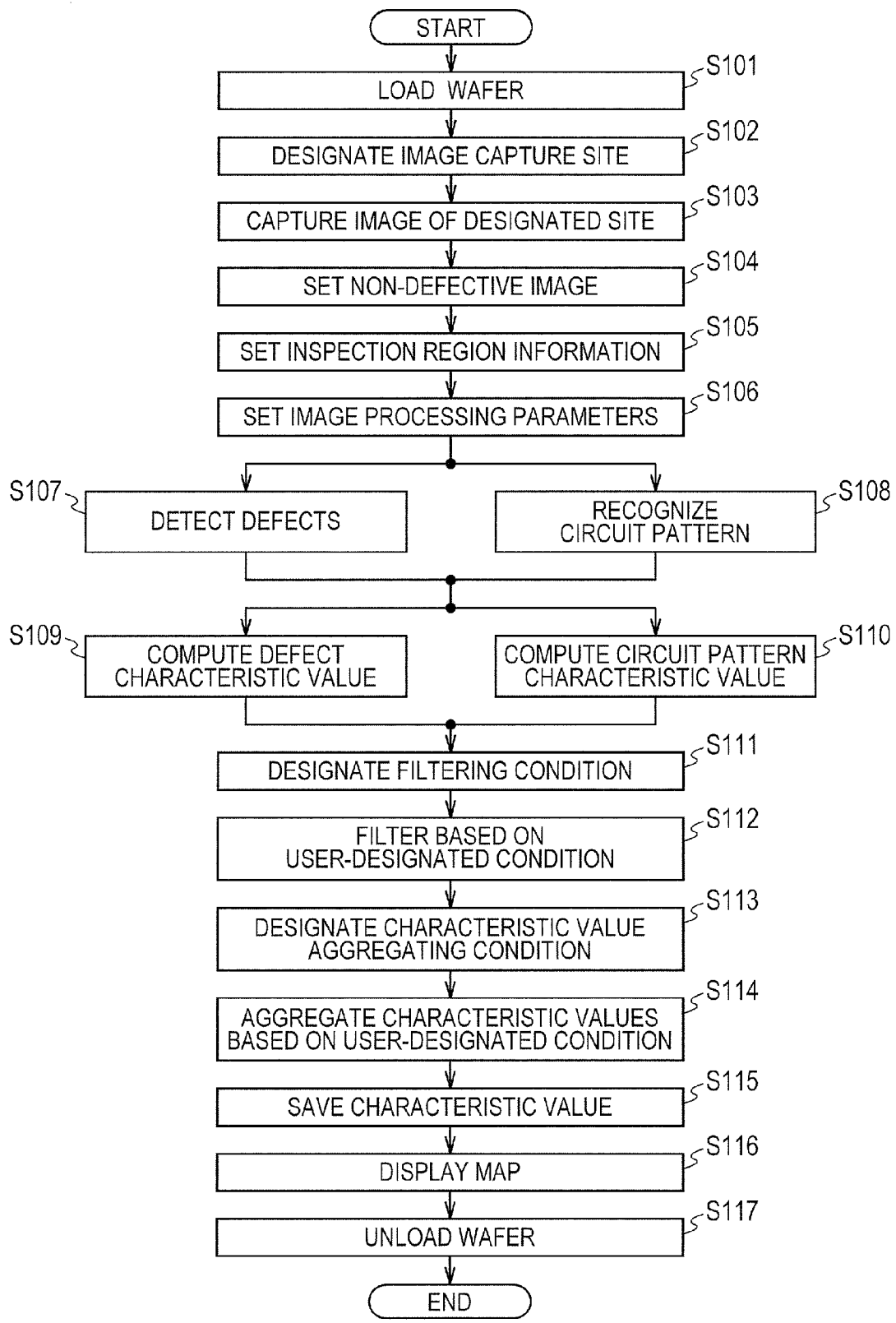
FIG. 1B is a flow diagram for showing a detailed flow of the inspection process according to the first embodiment.

An inspection flow according to the embodiment is the same as those of FIG. 1A and FIG. 1B described in the first embodiment, and the configuration of a device is the same as that of FIG. 2. However, the aggregation method of the characteristic values in S114 and the display method in S116 are different. Only a point different from the first embodiment will be described below.

Figure 20:
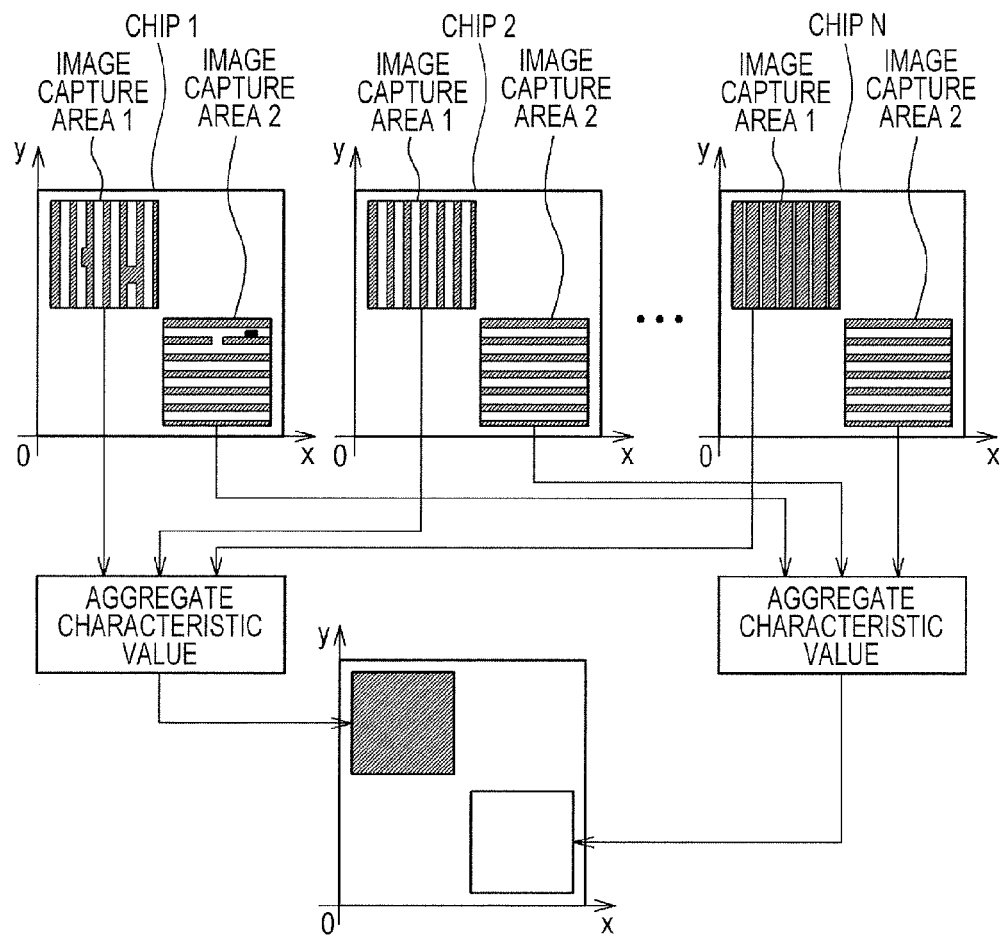
FIG. 20 is a flow diagram of a characteristic value aggregation process according to the second embodiment.

When aggregating the characteristic values in S114, the characteristic values are aggregated for each chip as shown in FIG. 18 in the first embodiment. In the second embodiment, the characteristic values are aggregated for each image capture area in a chip as shown in FIG. 20. The designating method of the characteristic value aggregation method is the same as that in the first embodiment.

Figure 19:
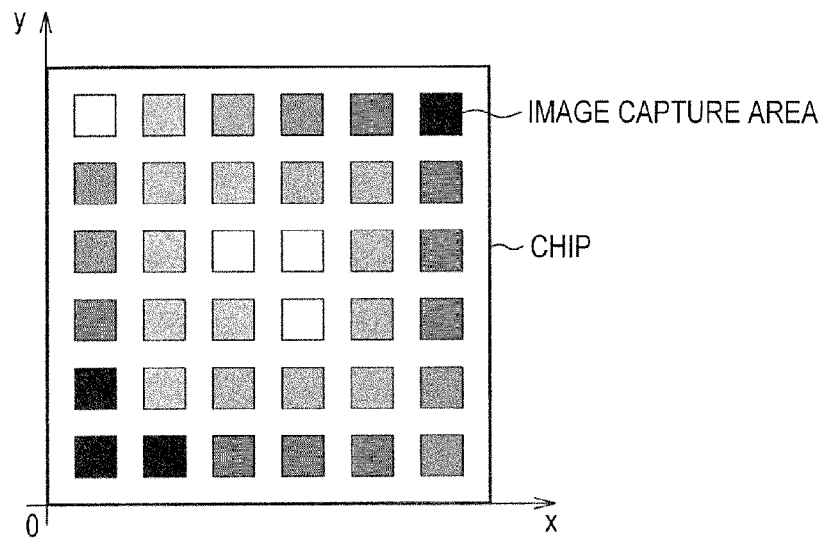
FIG. 19 is a front view of a part of a screen for showing an example of a display method of an inspection result according to a second embodiment.

Further, the magnitudes of the characteristic values are expressed by changing display colors in FIG. 19. However, as similar to the case of the first embodiment, for example, the magnitudes of the characteristic values may be expressed by changing the size of a drawing as shown in FIG. 15, or by using a three-dimensional graph as shown in FIG. 16.

Third Embodiment

In each of the first embodiment and the second embodiment, there has been described the inspection method in which a trend of occurrence of defects and a trend of changes in the shapes of circuit patterns on a wafer or in a chip are visualized by displaying the computed characteristic values on the basis of the mapping conditions designated by a user. In the case where the number of computed characteristic values is several tens to several hundreds, it becomes difficult to set conditions of producing a map by which a trend of fatal defects or circuit patterns can be recognized. Here in the third embodiment, a method of automatically computing candidates of mapping conditions will be described.

Figure 21A:
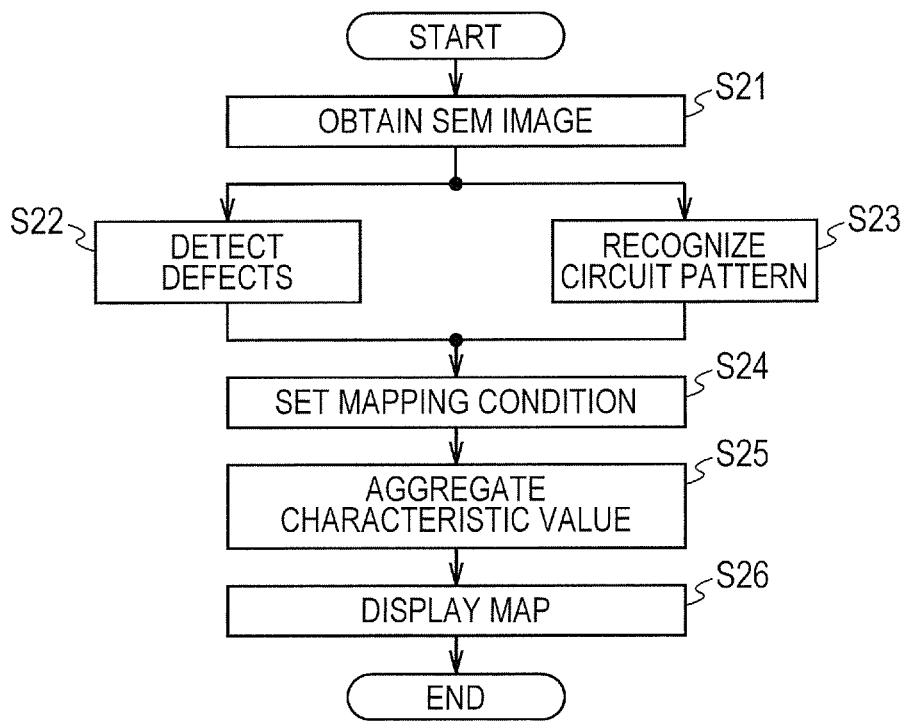
FIG. 21A is a flow diagram for showing an outline flow of an inspection process according to a third embodiment.

First, an outline of an inspection method in the third embodiment will be described using FIG. 21A. First of all, an SEM image of the sample wafer 209 is obtained by the SEM 201 (S21). Next, the obtained SEM image is processed by the inspection unit 202 to detect defects (S22), and recognize circuit patterns in the SEM image (S23). The defect detection process and the circuit pattern recognition process may be performed sequentially or in parallel. FIG. 21A shows a case of the parallel processing. These steps of the flow are the same as those of the first embodiment described in FIG. 1A. Next, conditions of mapping the detected defect image and circuit pattern image are set (S24), and characteristic values are computed from a desired image of defects or circuit patterns to be saved (S25). The computed characteristic values are displayed on a map on the basis of the set mapping conditions (S26), and the process is completed.

Next, the flow of the processes described in FIG. 21A will be described in detail using FIG. 21B.

Figure 21B:
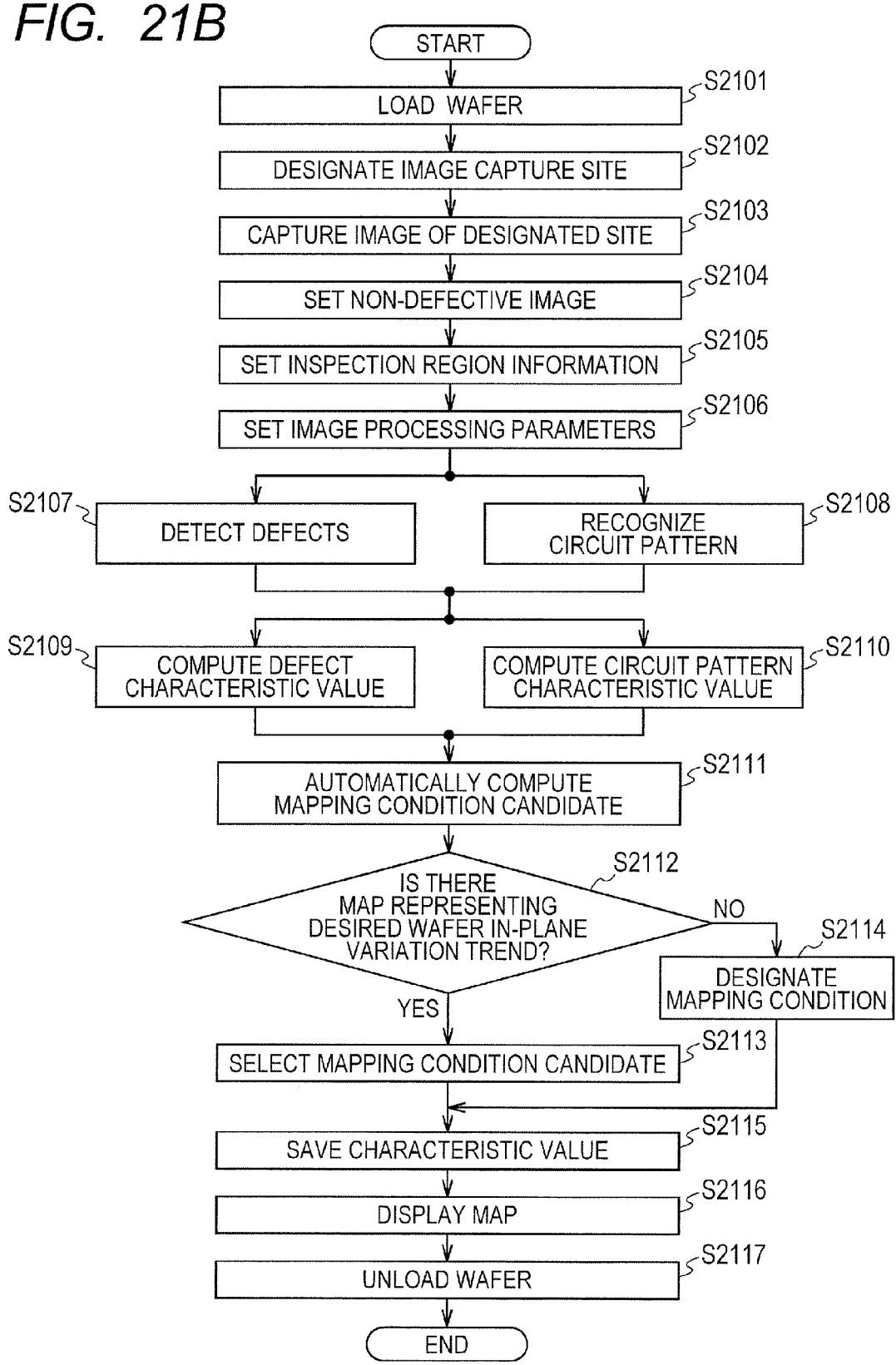
FIG. 21B is a flow diagram for showing a detailed flow of the inspection process according to the third embodiment.

S2101 to S2110 in the processing flow shown in FIG. 21B are the same as S101 to S110 in the processing flow shown in FIG. 1B of the inspection method in the first embodiment and the second embodiment as described above.

Next, the process (S24) of setting the conditions of mapping the detected defect image and circuit pattern image will be described. In the inspection method according to the third embodiment, the characteristic values of defects are computed in S2109 and the characteristic values of circuit patterns are computed in S2110. Thereafter, the mapping condition candidates are automatically computed (S2111). Next, it is determined by a user whether or not there exists a map representing a desired trend of changes in the wafer in-plane among the automatically-computed mapping condition candidates (S2112). If the map exists, the conditions are selected (S2113). If not, the mapping conditions are designated again (S2114). It should be noted that the designation of the mapping conditions in S2114 is the same as the designation (S111 to S114) of the mapping conditions in the first embodiment and the second embodiment.

Next, the computed characteristic values are saved (S2115) to display a map (S2116), and the wafer as an inspection target is finally unloaded (S2117). The steps of S2115 to S2117 are the same as those of S115 to S117 in the first embodiment and the second embodiment.

Figure 22:
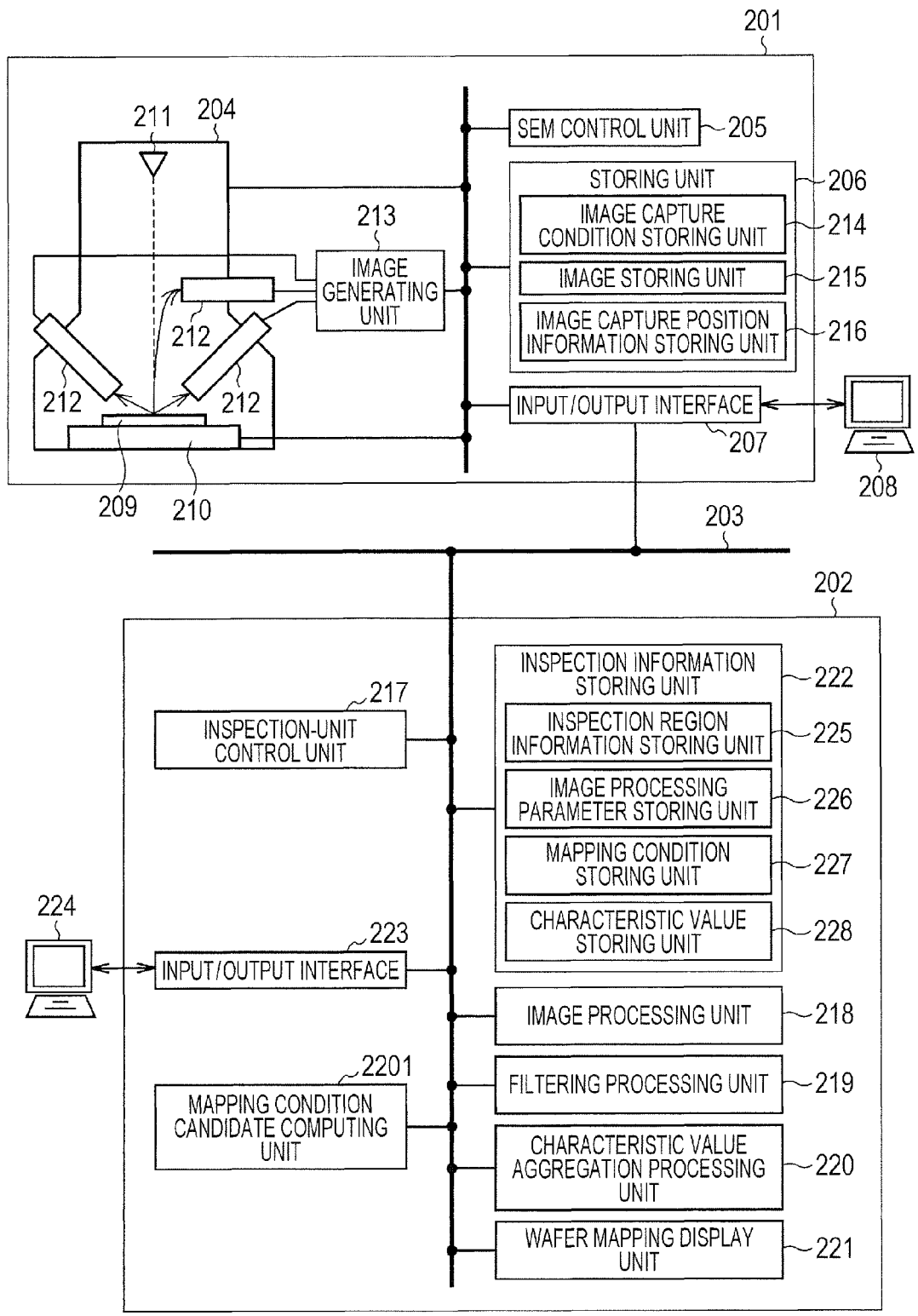
FIG. 22 is a block diagram for showing an outline configuration of an inspection device according to the third embodiment.

A device configuration according to the third embodiment is shown in FIG. 22. The device configuration shown in FIG. 22 is characterized in that a mapping condition candidate computing unit 2201 is provided in addition to the device configuration according to the first embodiment and the second embodiment. In the device configuration shown in FIG. 22, the same reference numerals are given to constitutional elements same as those shown in FIG. 2.

Figure 23:
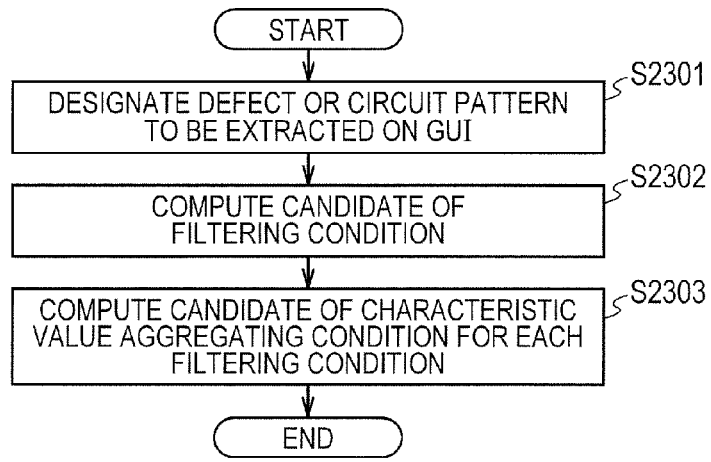
FIG. 23 is a flow diagram of an inspection condition automatic setting process according to the third embodiment.
Figure 25:
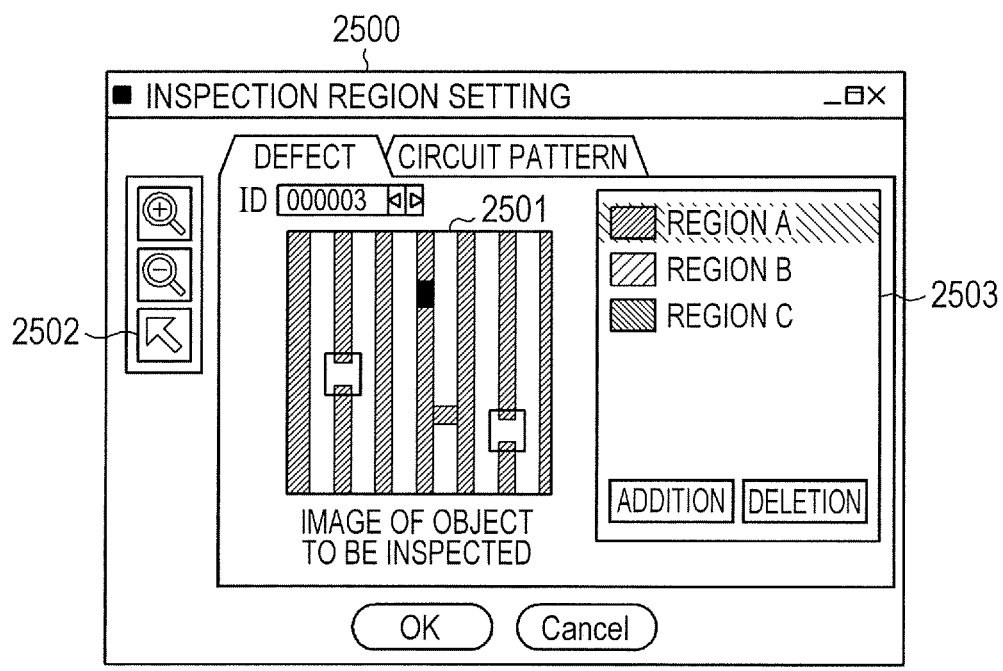
FIG. 25 is a front view of a screen related to designation of inspection conditions according to the third embodiment.

A flow of an automatic computing method of mapping condition candidates in S2111 processed by the mapping condition candidate computing unit 2201 will be described using FIG. 23. First, defects or circuit patterns to be extracted are designated on a GUI 2500 shown in FIG. 25 (S2301). In FIG. 25, provided is an interface 2503 on which one or more types of defects to be extracted can be defined using input means such as a mouse on an inspected image.

In FIG. 25, the reference numeral 2501 denotes an interface on which an inspected image and a defect detection result are displayed and selected defects are displayed while being highlighted. The selected defects are displayed by changing the display colors of the extracted defect areas or the selected defects on the inspected image, or displayed with frames. A user selects a pattern selection tool 2502 and clicks a defect to be extracted on the image 2501. It should be noted that plural types of defects to be extracted can be selected, and can be added and deleted on the interface 2503. FIG. 25 shows a selection method related to defects. However, circuit patterns can be designated by the similar method.

Next, candidates of filtering conditions for extracting only the designated defects or circuit patterns are computed (S2302). As a method, for example, a threshold value for separating patterns that are to be extracted from patterns that are not to be extracted is independently computed for each characteristic value, or an identifying plane for separating patterns that are to be extracted from patterns that are not to be extracted in a characteristic value space is computed using a conventional supervised learning method.

Next, candidates of characteristic value aggregating conditions are computed for each filtering condition (S2303). As a method thereof, for example, wafer maps for all the characteristic value aggregating conditions for each image capture area in a chip are produced as shown in FIG. 24, and characteristic value aggregating conditions in which the similar trend of changes can be observed irrespective of image capture areas may be obtained.

Figure 24:
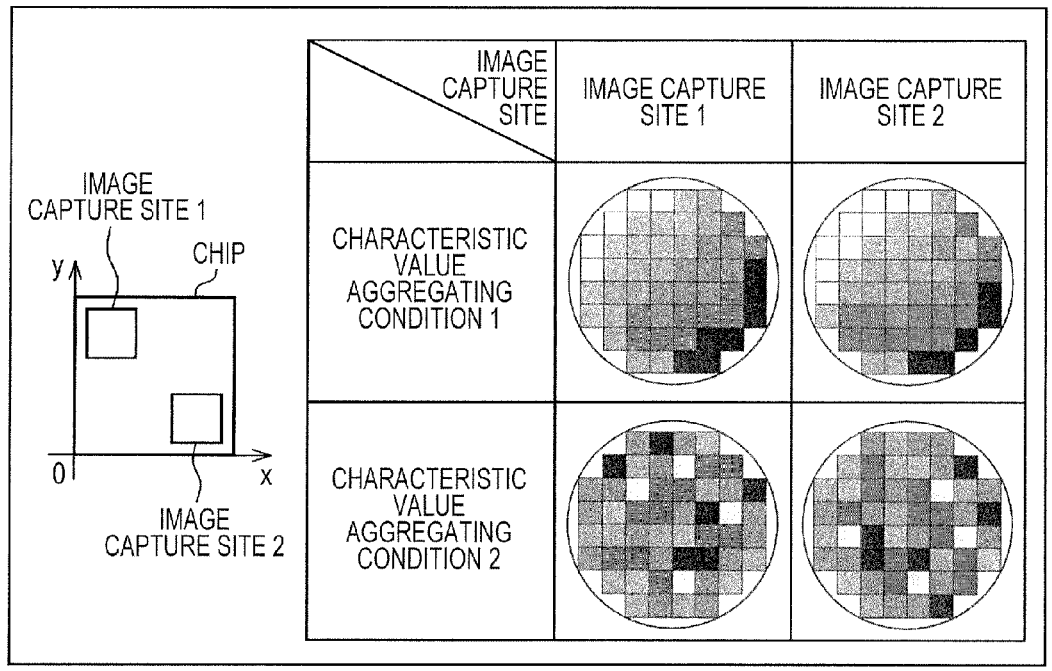
FIG. 24 is a diagram for showing a determination method of the inspection condition automatic setting process according to the third embodiment and a relation between image capture areas in a chip and characteristic value aggregating conditions.

In the example of FIG. 24, the similar trend of changes can be observed in a characteristic value aggregating condition 1 irrespective of image capture areas. However, the trend of the wafer map is changed depending on image capture areas in a characteristic value aggregating condition 2. In the case of the characteristic value aggregating conditions representing a trend of changes in the wafer in-plane, the trend of the wafer map is not changed depending on image capture areas, and the characteristic value aggregating conditions in which the trend of the wafer map is changed depending on image capture areas are excluded from the candidates. It should be noted that the similarity of the wafer map can be quantified by computing a correlation coefficient.

Figure 26:
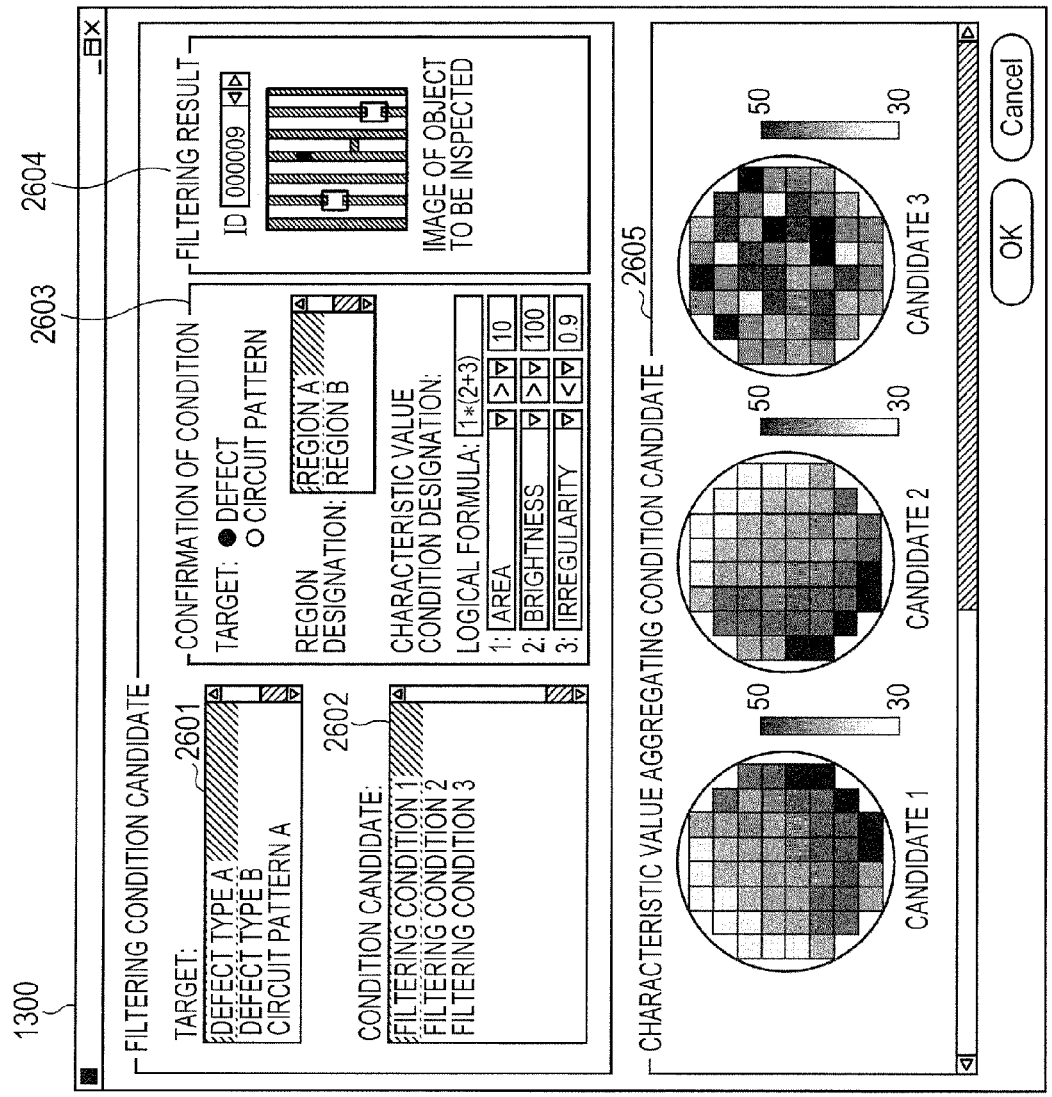
FIG. 26 is a front view of a screen related to designation of inspection conditions according to the third embodiment.

A GUI 2600 for confirming the mapping condition candidates produced in S2112 is shown in FIG. 26. First, a user selects one or more defects or circuit patterns designated on the interface 2503 of the GUI 2500 of FIG. 25 from an interface 2601. Next, one of the automatically-set filtering condition candidates is selected using an interface 2602, and the filtering conditions and the filtering result are confirmed using interfaces 2603 and 2604. An interface 2605 is an interface for displaying the wafer maps produced using the automatically-set characteristic value aggregating condition candidates, and a user selects characteristic value aggregating conditions from the interface 2605 to obtain a desired wafer map.

INDUSTRIAL APPLICABILITY

The present invention is used in processes of inspecting circuit patterns formed on a semiconductor wafer using image obtaining means in a production line of semiconductor wafers.

REFERENCE SINGS LIST

201 ... SEM
202 ... inspection unit
205 ... SEM control unit
206 ... storing unit
207 ... input/output interface
208 ... input/output terminal
217 ... inspection-unit control unit
218 ... image processing unit
219 ... filtering processing unit
220 ... characteristic value aggregation unit
221 ... inspection result display unit
222 ... inspection information storing unit
223 ... input/output interface
224 ... input/output terminal

The invention claimed is:

1. An inspection method for inspecting an inspection target, the method comprising:
    capturing an image of a designated area of the inspection target using an image capturing device;
    detecting defects by creating a defect detection result image of the designated area based on the captured image;
    recognizing circuit patterns by creating a circuit pattern recognition result image of the designated area based on the captured image, the circuit pattern recognition result image being different than the defect detection result image;
    computing characteristic values related to the grey value of the captured image and shapes from the detected defects;
    computing characteristic values related to the grey value of the captured image and shapes from the recognized circuit patterns;
    extracting circuit patterns by filtering from the recognized circuit patterns;
    determining characteristic values to be mapped among the characteristic values of the circuit patterns extracted by filtering; and
    displaying a distribution of the determined characteristic values on a screen in a map format.

2. The inspection method according to claim 1, wherein the extracting by filtering comprises receiving filtering conditions via a user interface.

3. The inspection method according to claim 1, wherein the step of determining characteristic values to be mapped comprises receiving the characteristic values via a user interface.

4. The inspection method according to claim 1, wherein the displaying on the screen in a map format comprises displaying a result of aggregating the characteristic values determined in the step of determining the characteristic values to be mapped for each of plural chips formed on the inspection target or for each region in the chip in a map format.

5. The inspection method according to claim 1, wherein the map format displayed on the screen is a wafer map.

6. The inspection method according to claim 1, wherein the map format displayed on the screen is a map in a chip.

7. The inspection method according to claim 1, wherein the extracting by filtering comprises filtering using filtering conditions selected to extract the circuit patterns designated on the screen.

8. A device for inspecting an inspection target, comprising:
    an image capture device configured to capture an image of a designated area of the inspection target;
    a detector configured to detect defects by creating a defect detection result image of the designated area based on the captured image;
    a recognizer configured to recognize circuit patterns by creating a circuit pattern recognition result image of the designated area based on the captured image, the circuit pattern recognition result image being different than the defect detection result image;
    a defect characteristic value computer configured to compute characteristic values related to the grey value of the captured image and shapes from the detected defects;
    a circuit pattern characteristic value computer configured to compute characteristic values related to the grey value of the captured image and shapes from the recognized circuit patterns;
    an extractor configured to extract circuit patterns by filtering from the defects detected by the detector and the circuit patterns recognized by the recognizer;
    an characteristic value determiner configured to determine characteristic values to be mapped among the characteristic values of the circuit patterns extracted by filtering by the extractor; and
    a display unit configured to display a distribution status of the characteristic values determined by the determiner on a screen in a map format.

9. The inspection device according to claim 8, wherein conditions filtered by the extractor are those set on the screen.

10. The inspection device according to claim 8, wherein the characteristic values to be mapped determined by the characteristic value determiner are those set on the screen.

11. The inspection device according to claim 8, wherein the display unit is configured to display in a map format a result of aggregating the characteristic values determined by the characteristic value determiner to be mapped for each of plural chips formed on the inspection target or for each region in the chip.

12. The inspection device according to claim 8, wherein the map format displayed on the screen by the display unit is a wafer map.

13. The inspection device according to claim 8, wherein the map format displayed on the screen by the display unit is a map in a chip.

14. The inspection device according to claim 8, wherein the conditions filtered by the extractor are those set so as to extract the circuit patterns designated on the screen.

15. The inspection device according to claim 8, wherein the image capture device comprises:
 an energy source configured to irradiate a sample; and
 one or more detectors configured to detect electrons reflected from the sample.

16. An inspection method for inspecting an inspection target, the method comprising:
 capturing an image of a designated area of the inspection target using an image capturing device;
 detecting defects by creating a defect detection result image of the designated area based on the captured image;
 recognizing circuit patterns by creating a circuit pattern recognition result image of the designated area based on the captured image, the circuit pattern recognition result image being different than the defect detection result image;
 computing characteristic values related to the grey value of the captured image and shapes from the detected defects;
 computing characteristic values related to the grey value of the captured image and shapes from the recognized circuit patterns;
 extracting specific defects or circuit patterns by filtering from the detected defects and recognized circuit patterns;
 determining characteristic values to be mapped among the characteristic values of the specific defects or circuit patterns extracted by filtering; and
 displaying a distribution of the determined characteristic values on a screen in a map format,
 wherein recognizing circuit patterns comprises extracting an outline of the circuit patterns based on a change in a grey value and recognizing an inner region of the circuit patterns based on the grey value and a changing direction of the grey value.

17. A device for inspecting an inspection target, comprising:
 an image capture device configured to capture an image of a designated area of the inspection target;
 a detector configured to detect defects by creating a defect detection result image of the designated area based on the captured image;
 a recognizer configured to recognize circuit patterns by creating a circuit pattern recognition result image of the designated area based on the captured image, the circuit pattern recognition result image being different than the defect detection result image;
 a defect characteristic value computer configured to compute characteristic values related to the grey value of the captured image and shapes from the detected defects;
 a circuit pattern characteristic value computer configured to compute characteristic values related to the grey value of the captured image and shapes from the recognized circuit patterns;
 an extractor configured to extract specific defects or circuit patterns by filtering from the defects detected by the detector and the circuit patterns recognized by the recognizer;
 an characteristic value determiner configured to determine characteristic values to be mapped among the characteristic values of the specific defects or circuit patterns extracted by filtering by the extractor; and
 a display unit configured to display a distribution status of the characteristic values determined by the determiner on a screen in a map format,
 wherein the recognizer is configured to extract an outline of the circuit patterns based on a change in a grey value and recognize an inner region of the circuit patterns based on the grey value and a changing direction of the grey value.

* * * * *